(12) United States Patent
Choi et al.

(10) Patent No.: US 12,796,201 B2
(45) Date of Patent: Nov. 10, 2026

(54) DISPLAY DEVICE COMPRISING SEMICONDUCTOR LIGHT-EMITTING ELEMENTS AND METHOD FOR MANUFACTURING SAME

(71) Applicants: LG ELECTRONICS INC., Seoul (KR); LG DISPLAY CO., LTD., Seoul (KR)

(72) Inventors: Wonseok Choi, Seoul (KR); Gisang Hong, Paju-si (KR); Eunhye Lee, Paju-si (KR); Jungmin Kim, Paju-si (KR); Hun Jang, Paju-si (KR); Hyeseon Eom, Paju-si (KR); Moonsun Lee, Paju-si (KR); Juhyun Nam, Paju-si (KR)

(73) Assignees: LG ELECTRONICS INC., Seoul (KR); LG DISPLAY CO., LTD., Seoul (KR)

( * ) Notice: Subject to any disclaimer, the term of this patent is extended or adjusted under 35 U.S.C. 154(b) by 377 days.

(21) Appl. No.: 18/688,172

(22) PCT Filed: Sep. 1, 2022

(86) PCT No.: PCT/KR2022/013143
§ 371 (c)(1),
(2) Date: Feb. 29, 2024

(87) PCT Pub. No.: WO2023/033572
PCT Pub. Date: Mar. 9, 2023

(65) Prior Publication Data

US 2025/0006879 A1 Jan. 2, 2025

(30) Foreign Application Priority Data

Sep. 1, 2021 (KR) ........................ 10-2021-0116485

(51) Int. Cl.
*H10H 20/857* (2025.01)
*H10W 90/00* (2026.01)
*H10H 20/01* (2025.01)

(52) U.S. Cl.
CPC .......... *H10H 20/857* (2025.01); *H10W 90/00* (2026.01); *H10H 20/0364* (2025.01)

(58) Field of Classification Search
None
See application file for complete search history.

(56) References Cited

U.S. PATENT DOCUMENTS

2018/0122788 A1 5/2018 Wu et al.
2020/0168777 A1 5/2020 Kang
(Continued)

FOREIGN PATENT DOCUMENTS

EP 4 376 085 A1 5/2024
KR 10-2019-0104277 A 9/2019
(Continued)

OTHER PUBLICATIONS

International Search Report (PCT/ISA/210) issued in PCT/KR2022/013143 mailed on Dec. 27, 2022.

*Primary Examiner* — Michelle Mandala
(74) *Attorney, Agent, or Firm* — Birch, Stewart, Kolasch & Birch, LLP

(57) ABSTRACT

The manufacturing method of the display device according to the embodiment includes a step of self-aligning the light emitting device inside the opening of the planarization layer overlapping the first assembly wiring and the second assembly wiring, a step of sequentially forming a conductive layer and an organic layer on a planarization layer and a light emitting device, a step of ashing the organic layer to remove the second part on the first part of the organic layer, and a step of forming a contact electrode by etching the conductive layer corresponding to the second part, wherein the
(Continued)

contact electrode is in contact with the side of the first semiconductor layer below the light emitting device.

20 Claims, 27 Drawing Sheets

(56) References Cited

U.S. PATENT DOCUMENTS

| | | | | |
|---|---|---|---|---|
| 2020/0365567 | A1 | 11/2020 | Park et al. | |
| 2021/0159250 | A1* | 5/2021 | Chang | G09G 3/3233 |
| 2022/0029058 | A1 | 1/2022 | Kim et al. | |
| 2022/0077253 | A1* | 3/2022 | Yang | H10K 59/38 |
| 2022/0246583 | A1 | 8/2022 | Park et al. | |
| 2022/0254961 | A1 | 8/2022 | Chang et al. | |
| 2023/0005887 | A1 | 1/2023 | Kwon et al. | |
| 2023/0187580 | A1 | 6/2023 | Byun et al. | |
| 2023/0268330 | A1* | 8/2023 | Kim | H10W 90/00 257/79 |
| 2023/0352639 | A1* | 11/2023 | Yi | H10H 20/841 |
| 2024/0266491 | A1 | 8/2024 | Chung et al. | |

FOREIGN PATENT DOCUMENTS

| | | | |
|---|---|---|---|
| KR | 10-2030323 | B1 | 10/2019 |
| KR | 10-2020-0026775 | A | 3/2020 |
| KR | 10-2020-0066438 | A | 6/2020 |
| KR | 10-2020-0099037 | A | 8/2020 |
| KR | 10-2020-0106039 | A | 9/2020 |
| KR | 10-2024-0122809 | A | 8/2024 |

* cited by examiner

[FIG. 1]
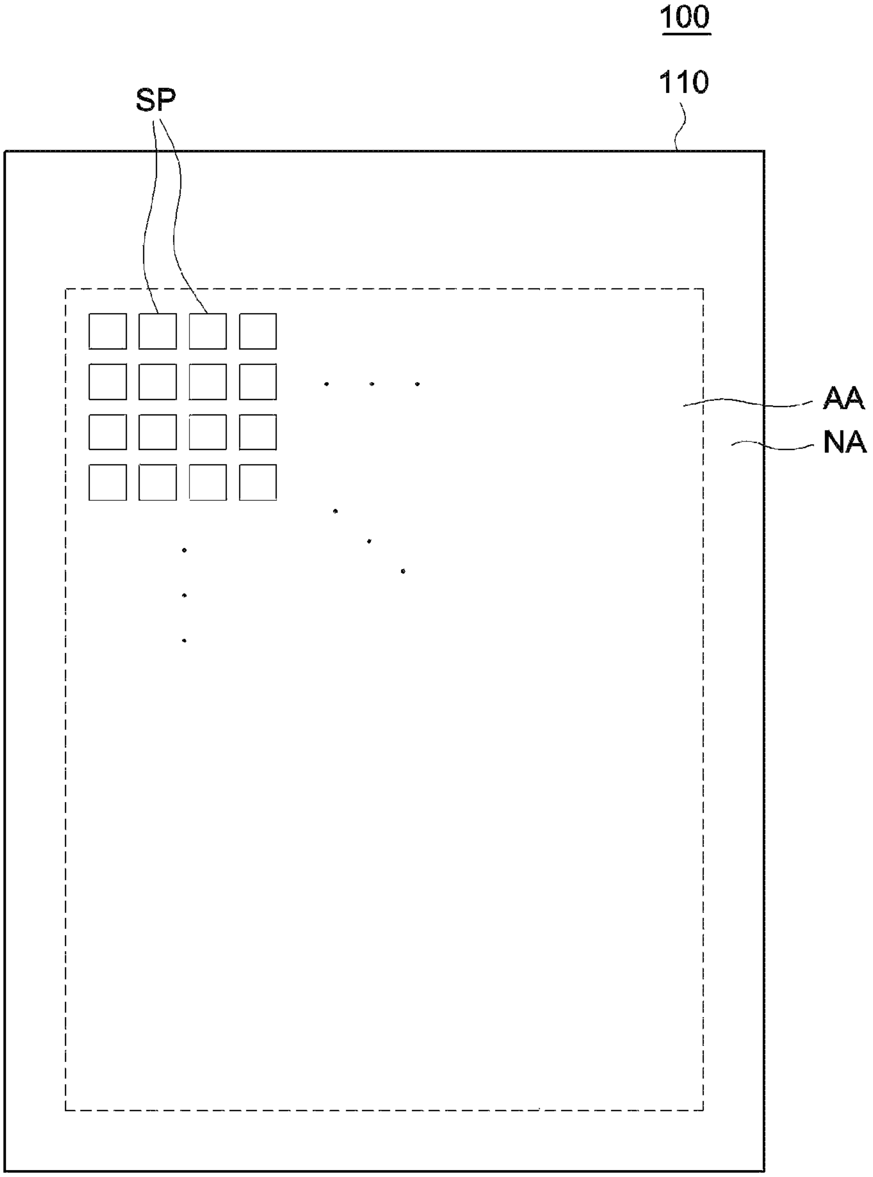

[FIG. 2]
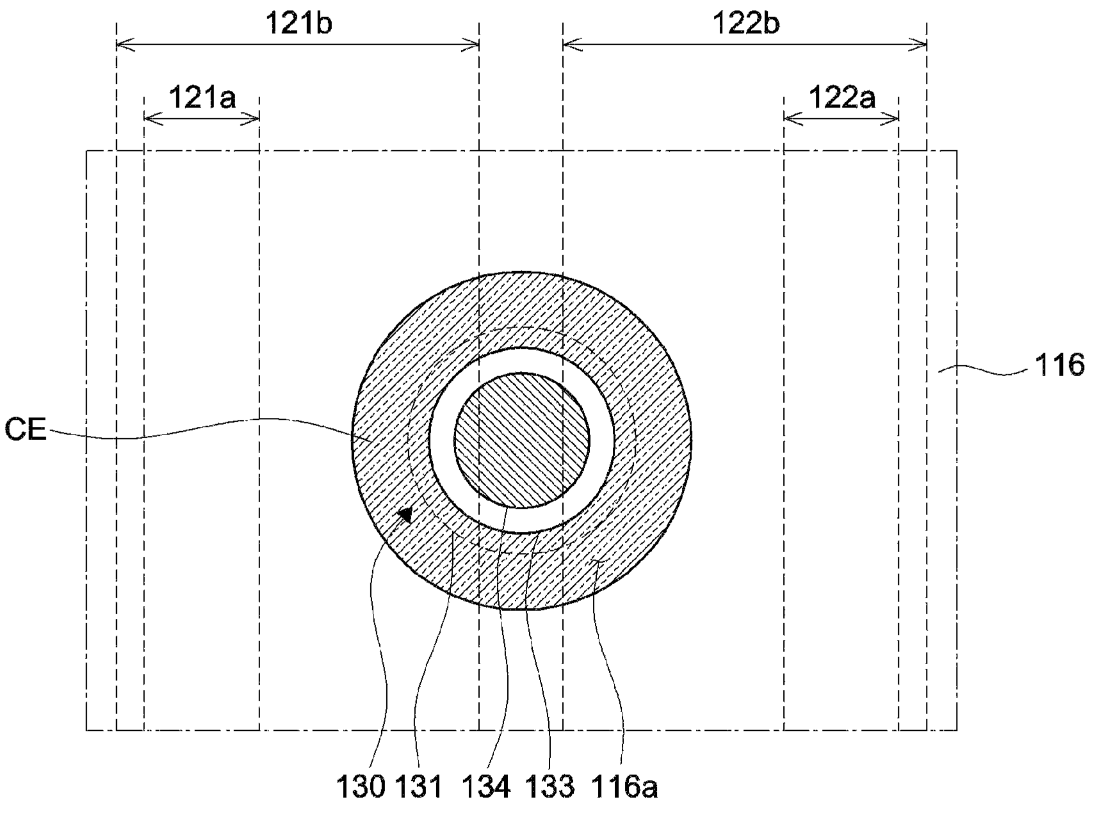

[FIG. 3]
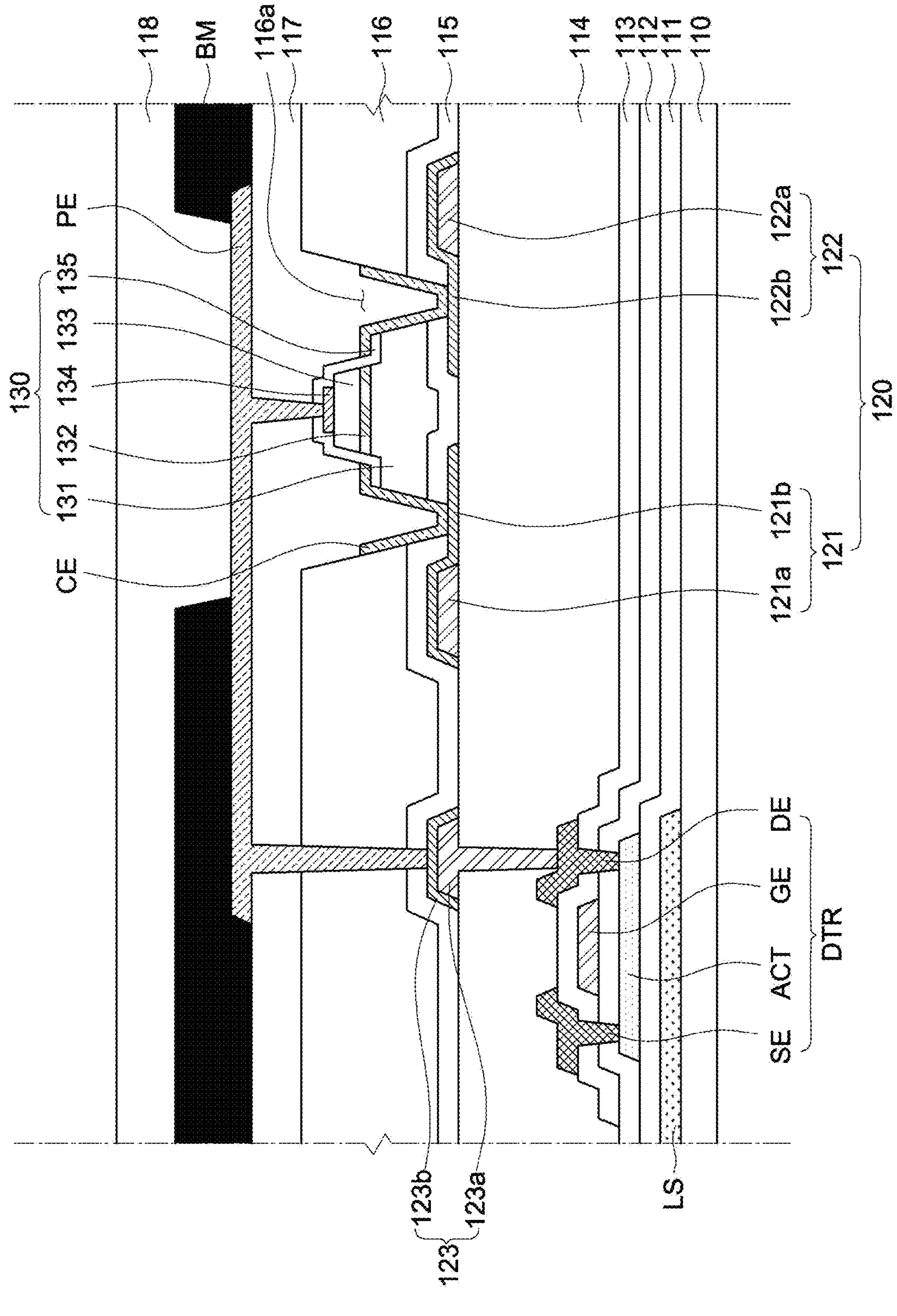

[FIG. 4A]
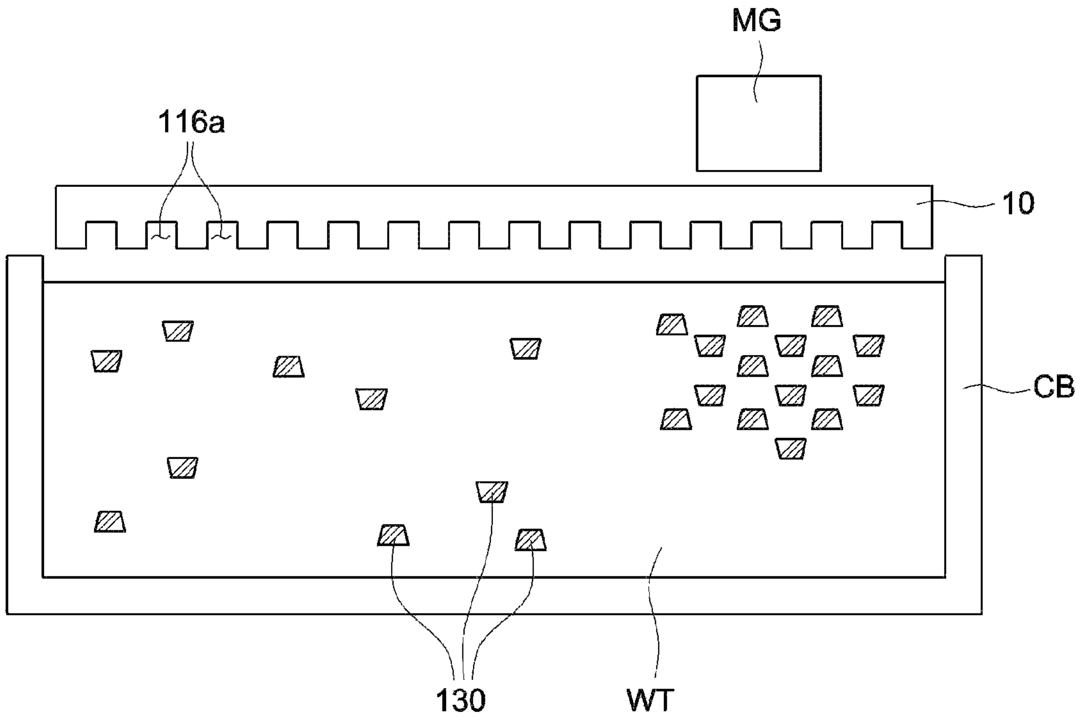

[FIG. 4B]
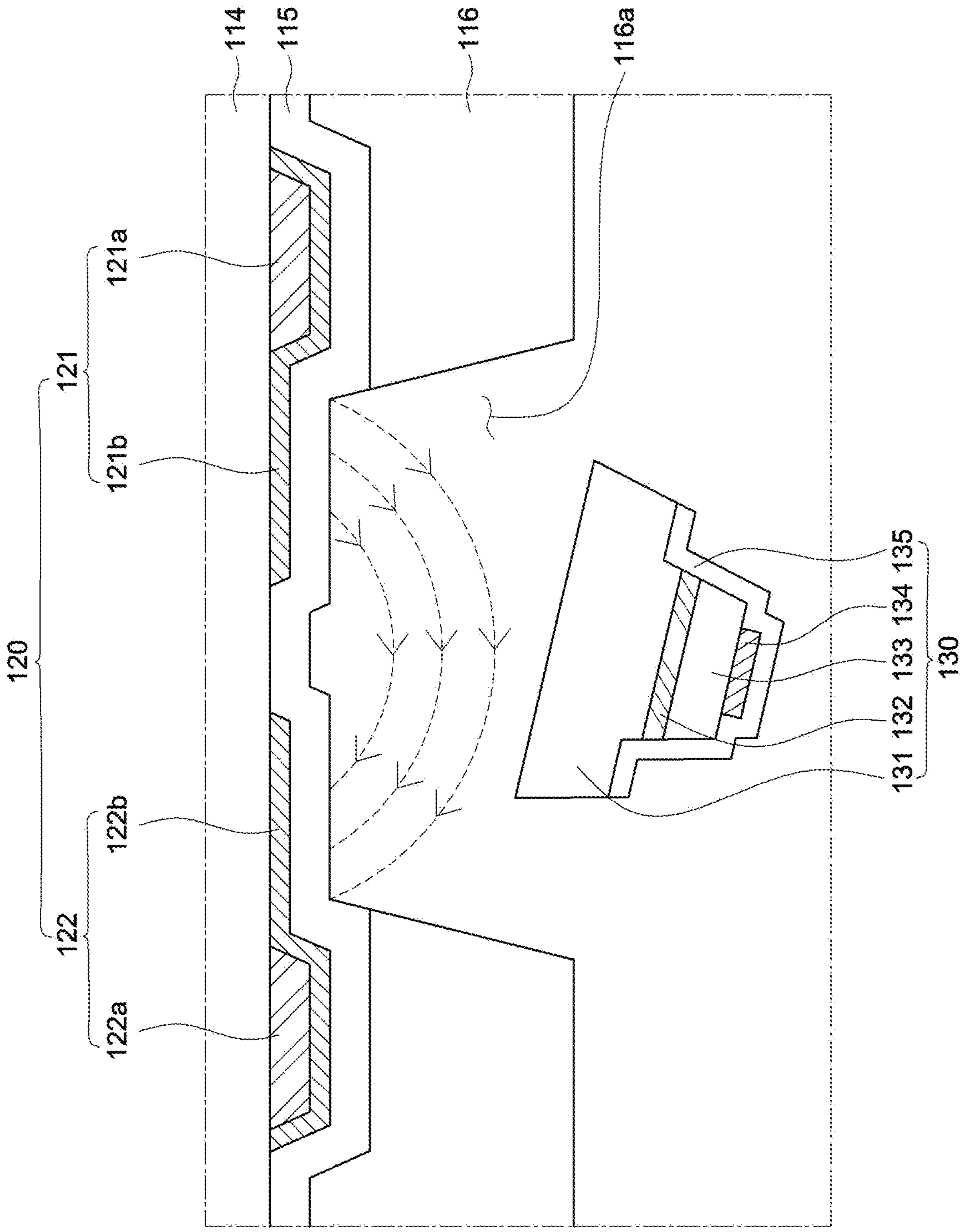

[FIG. 4C]
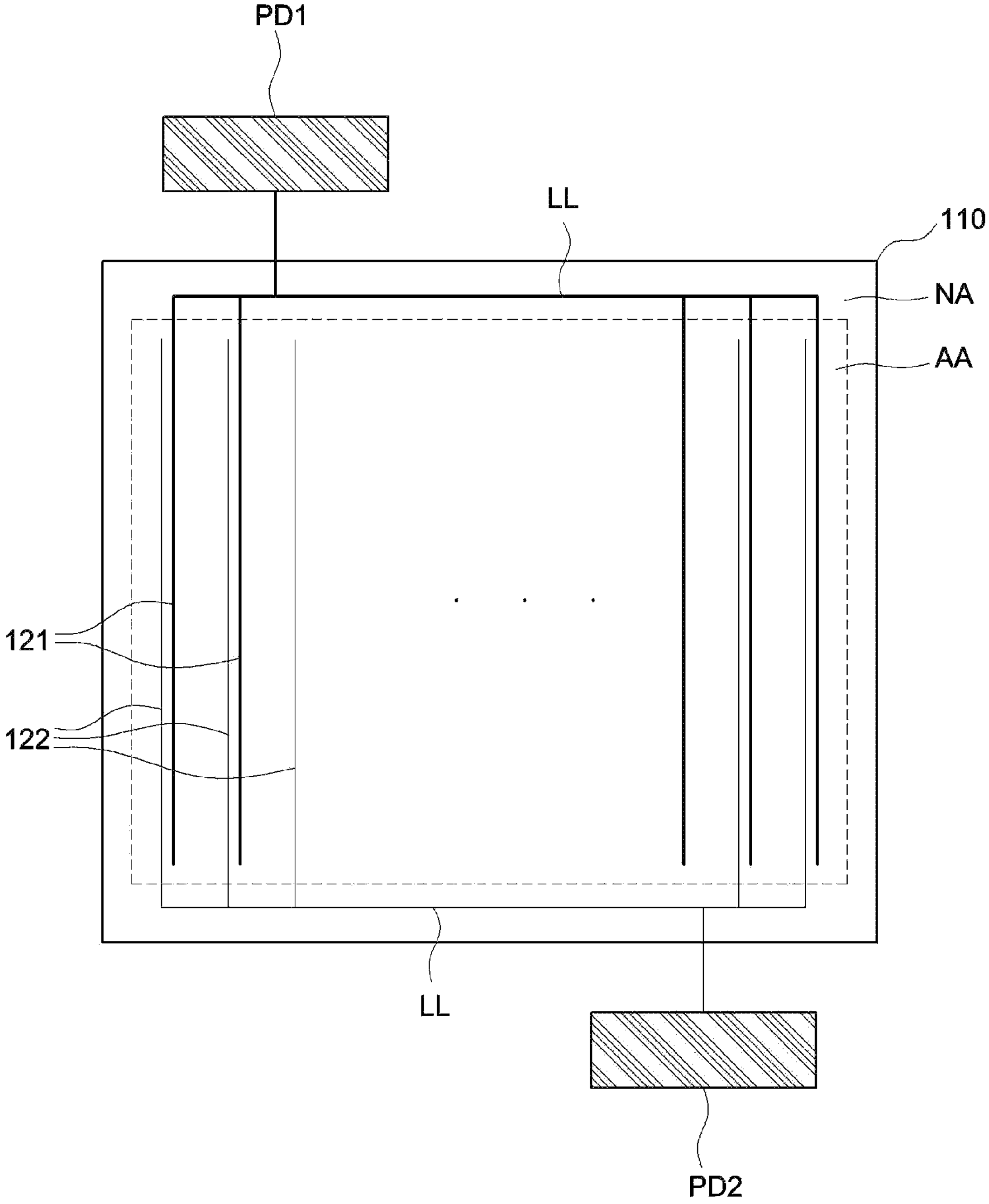

[FIG. 5A]
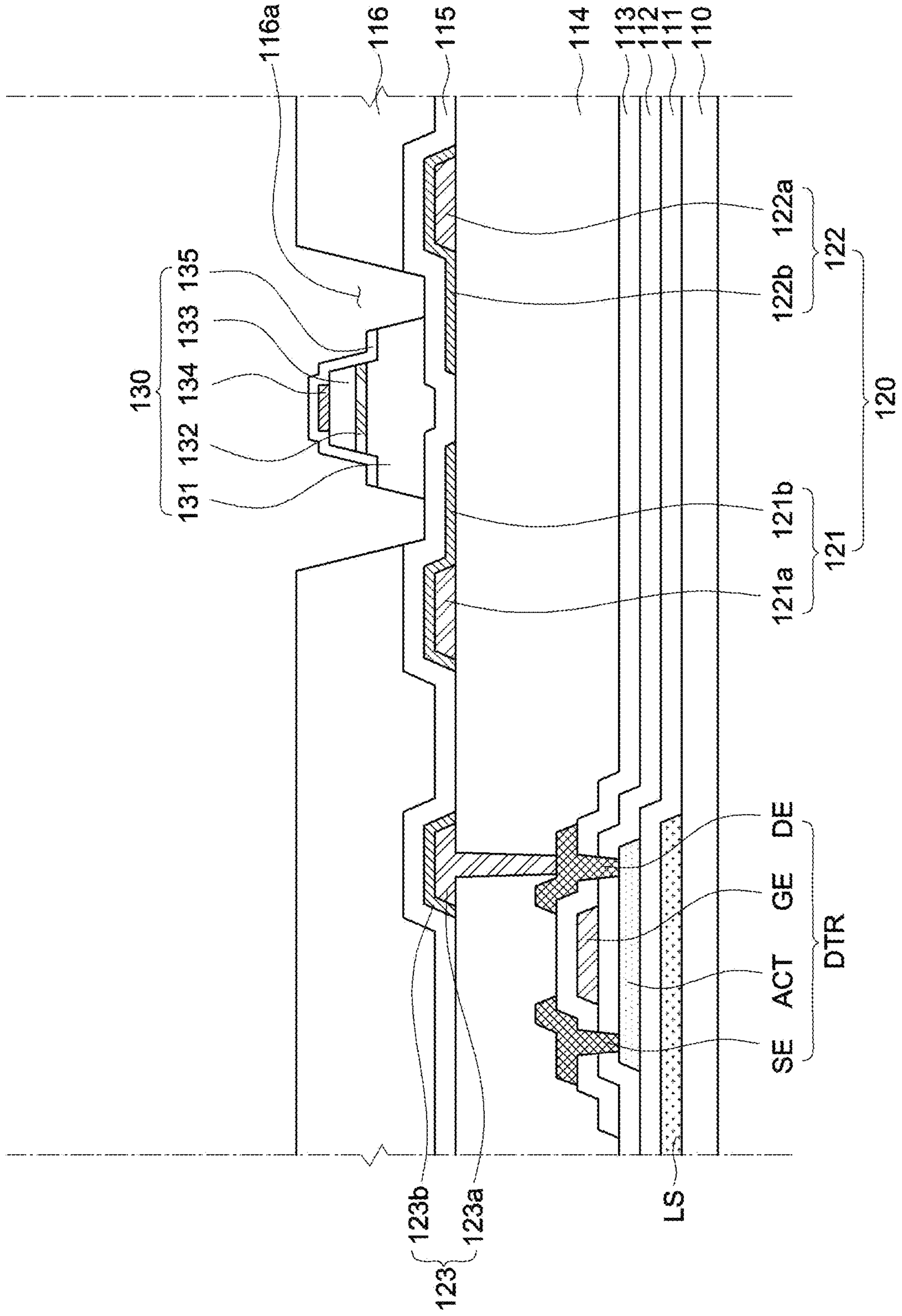

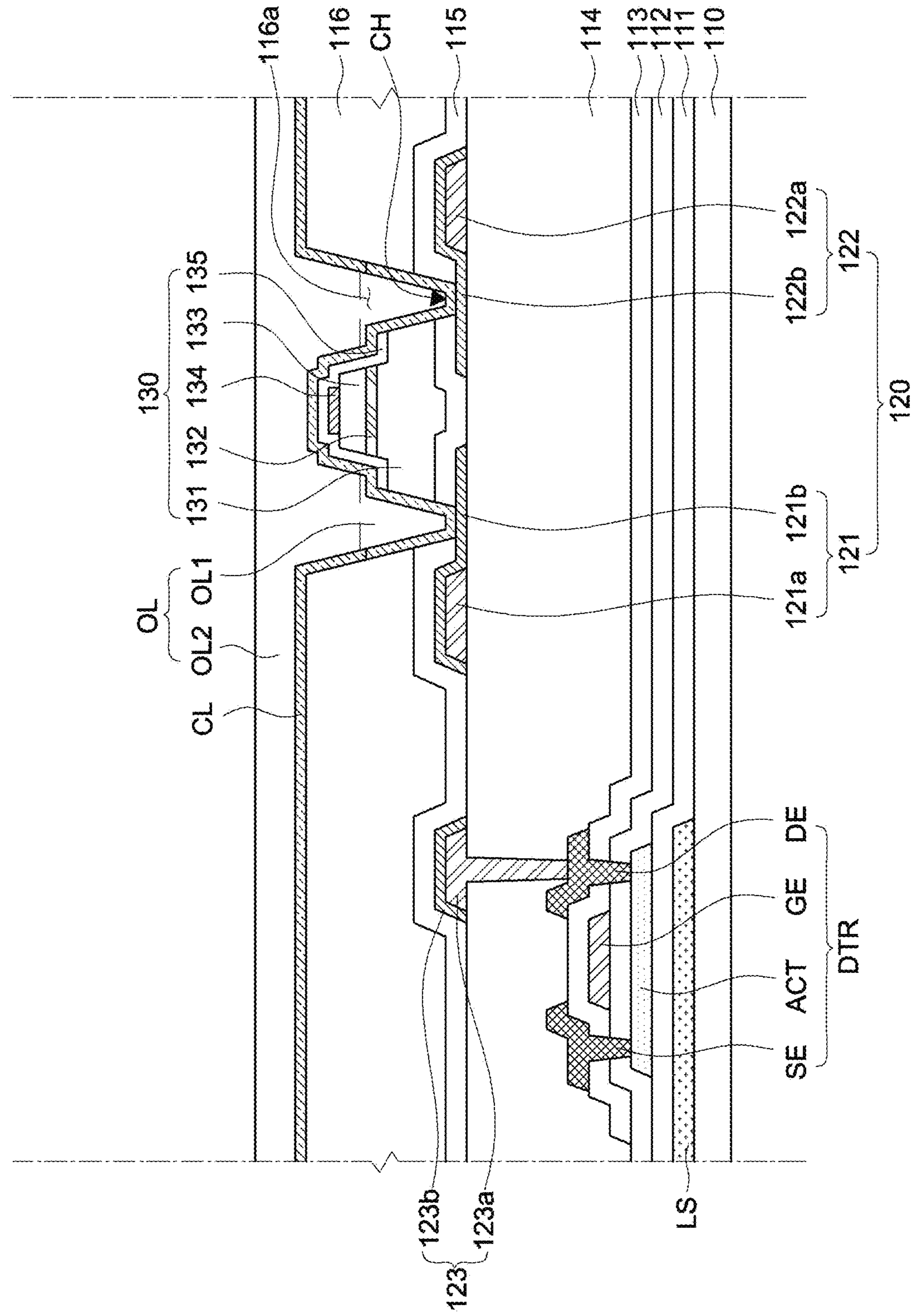
[FIG. 5B]

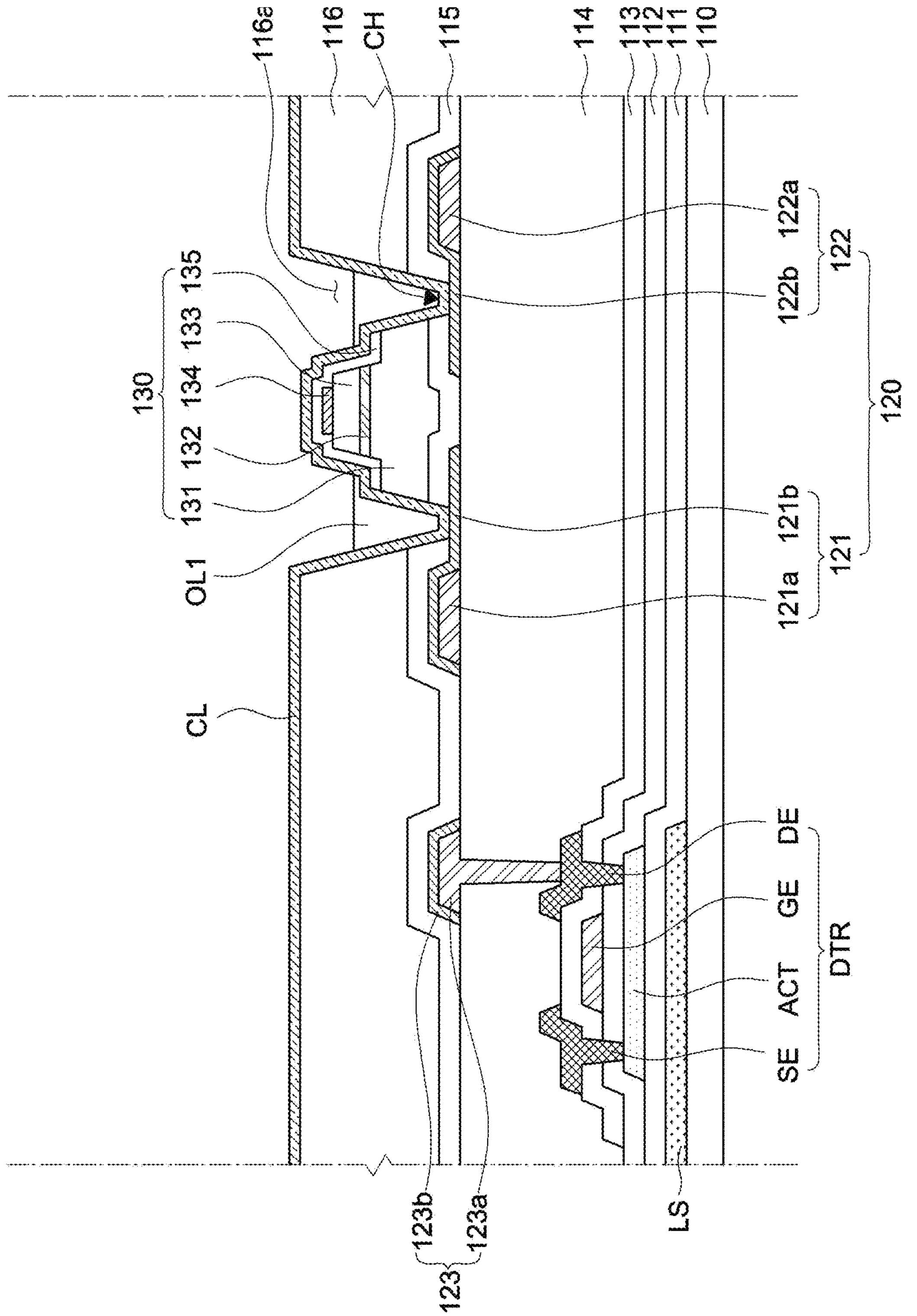
[FIG. 5C]

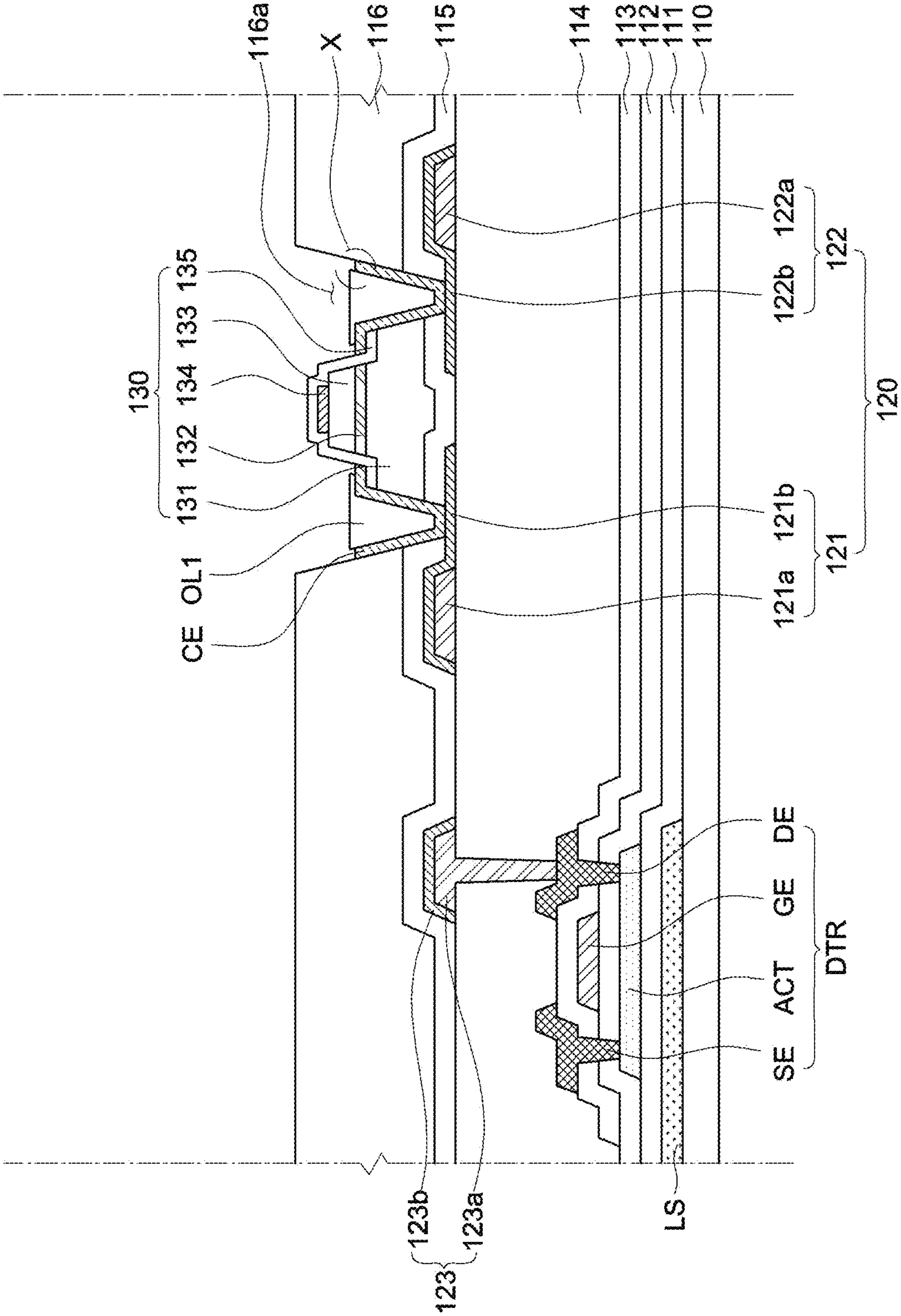
[FIG. 5D]

[FIG. 5E]
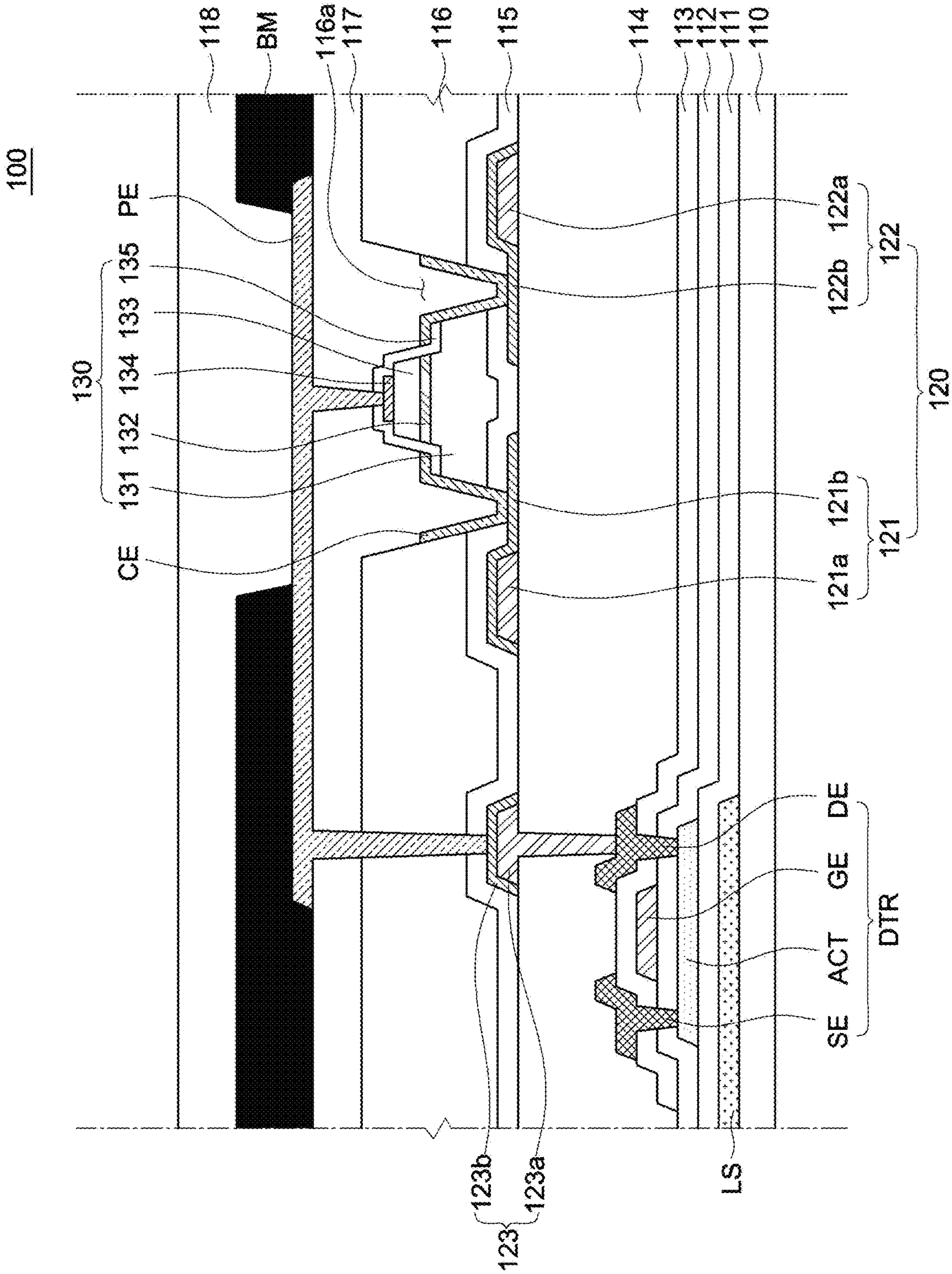

[FIG. 6]
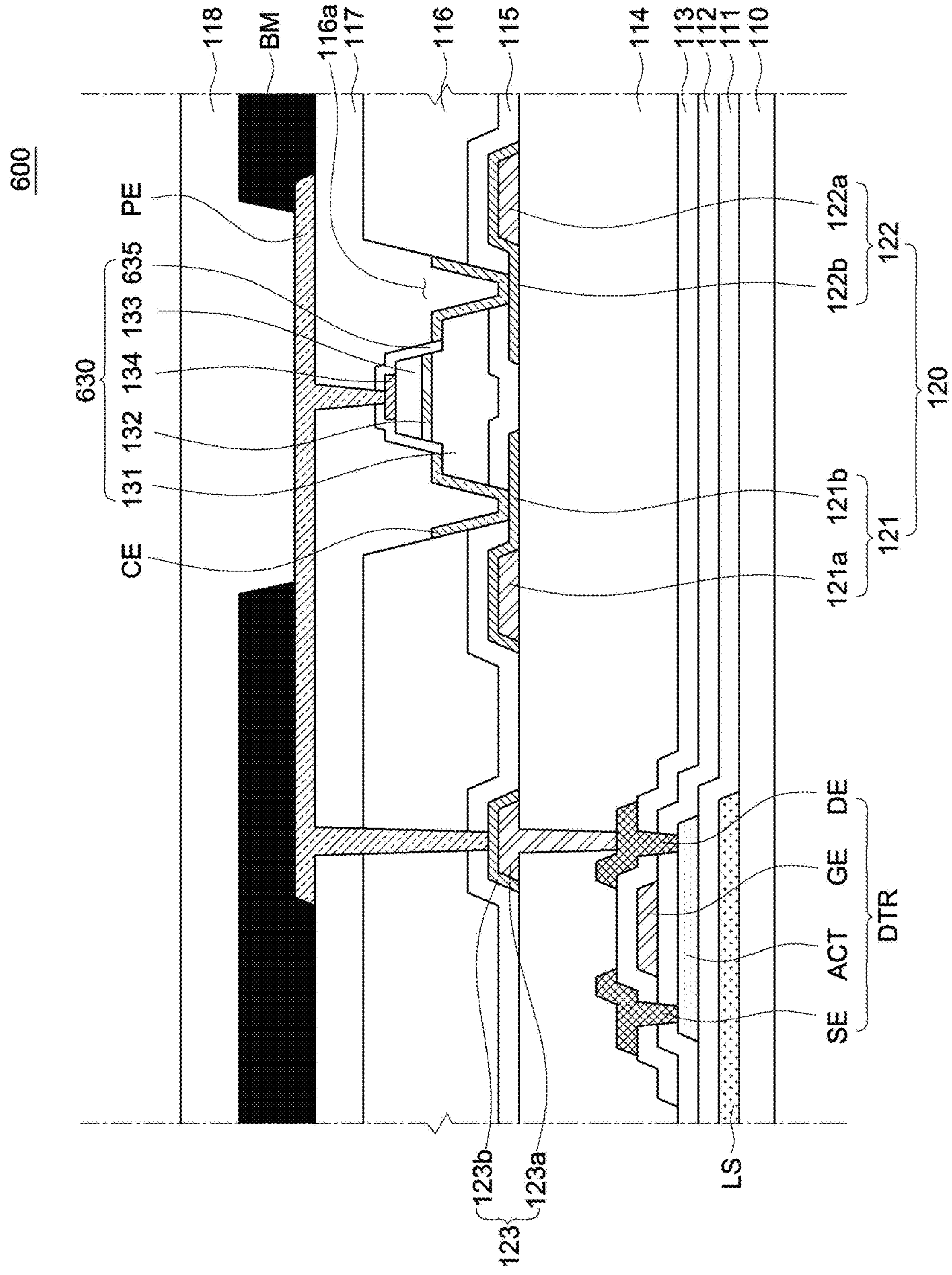

[FIG. 7]
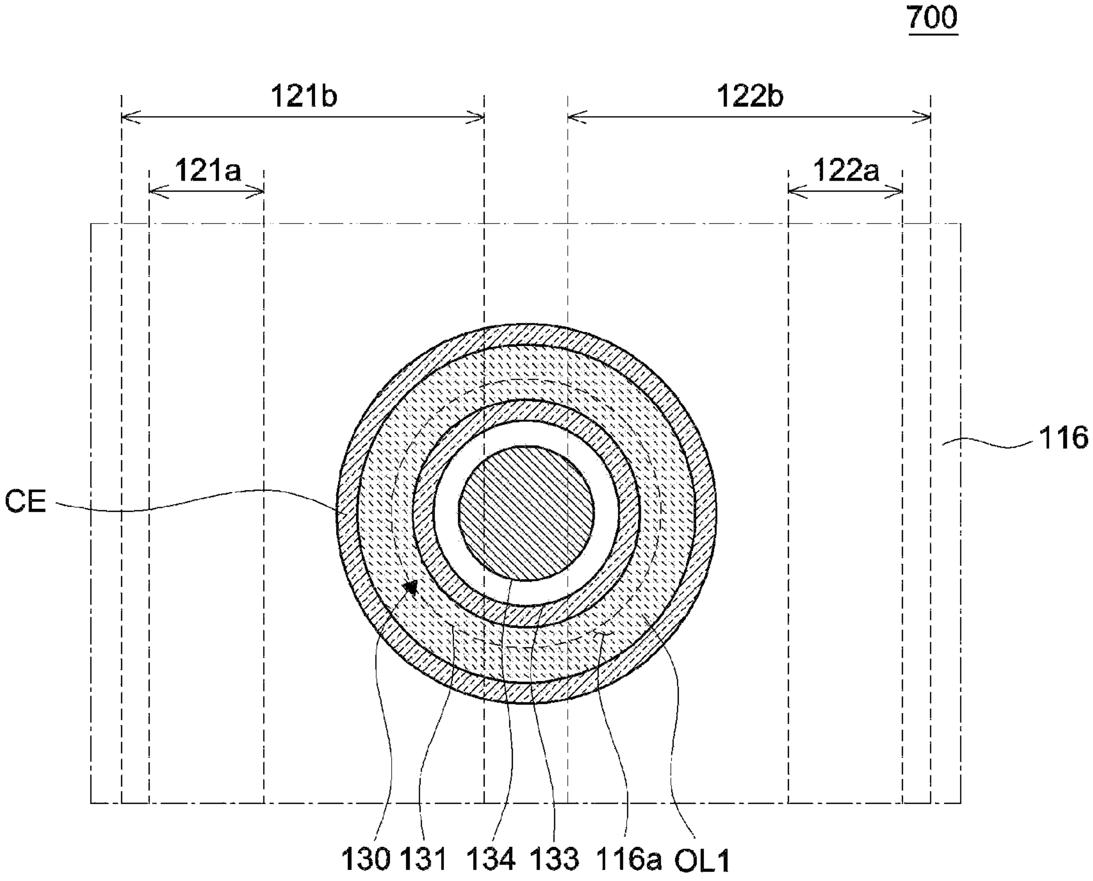

[FIG. 8]
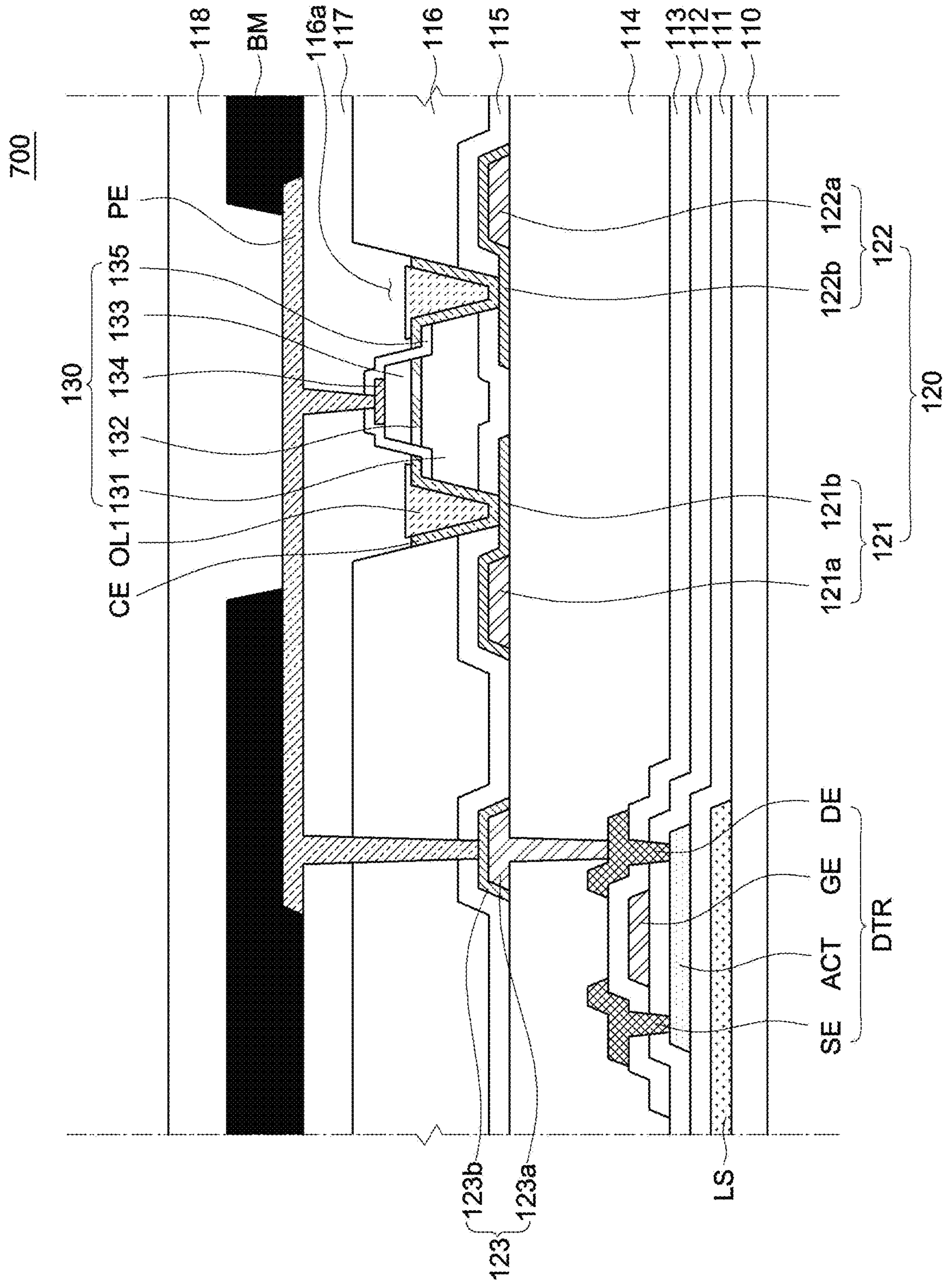

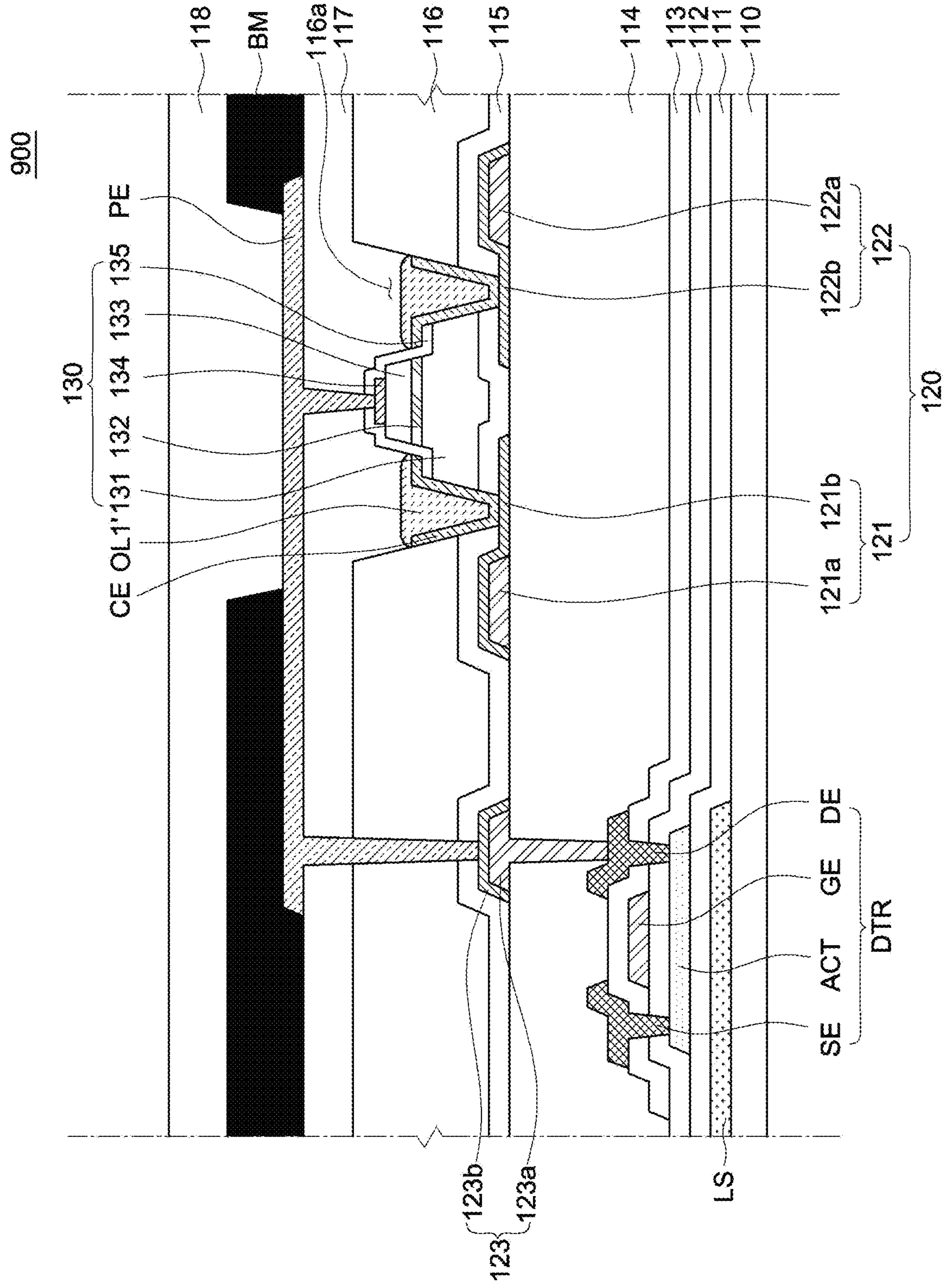
[FIG. 9]

[FIG. 10]
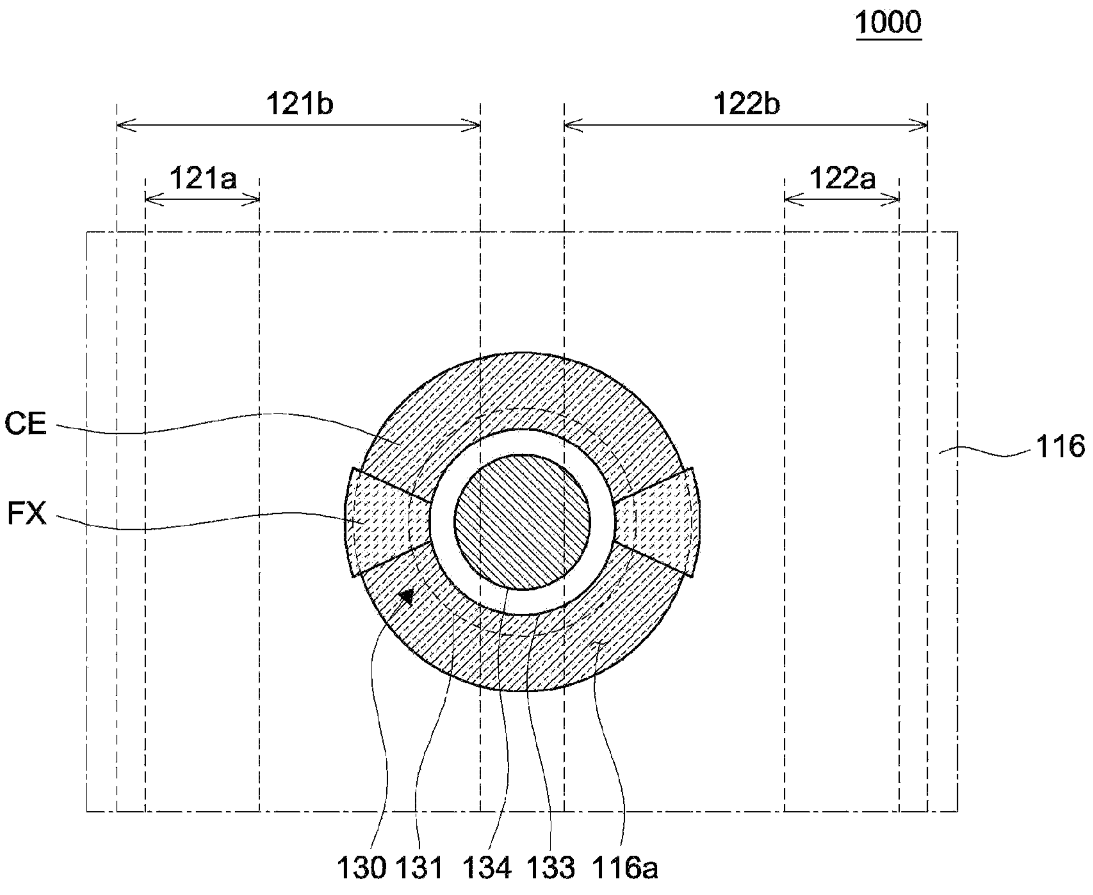

[FIG. 11]
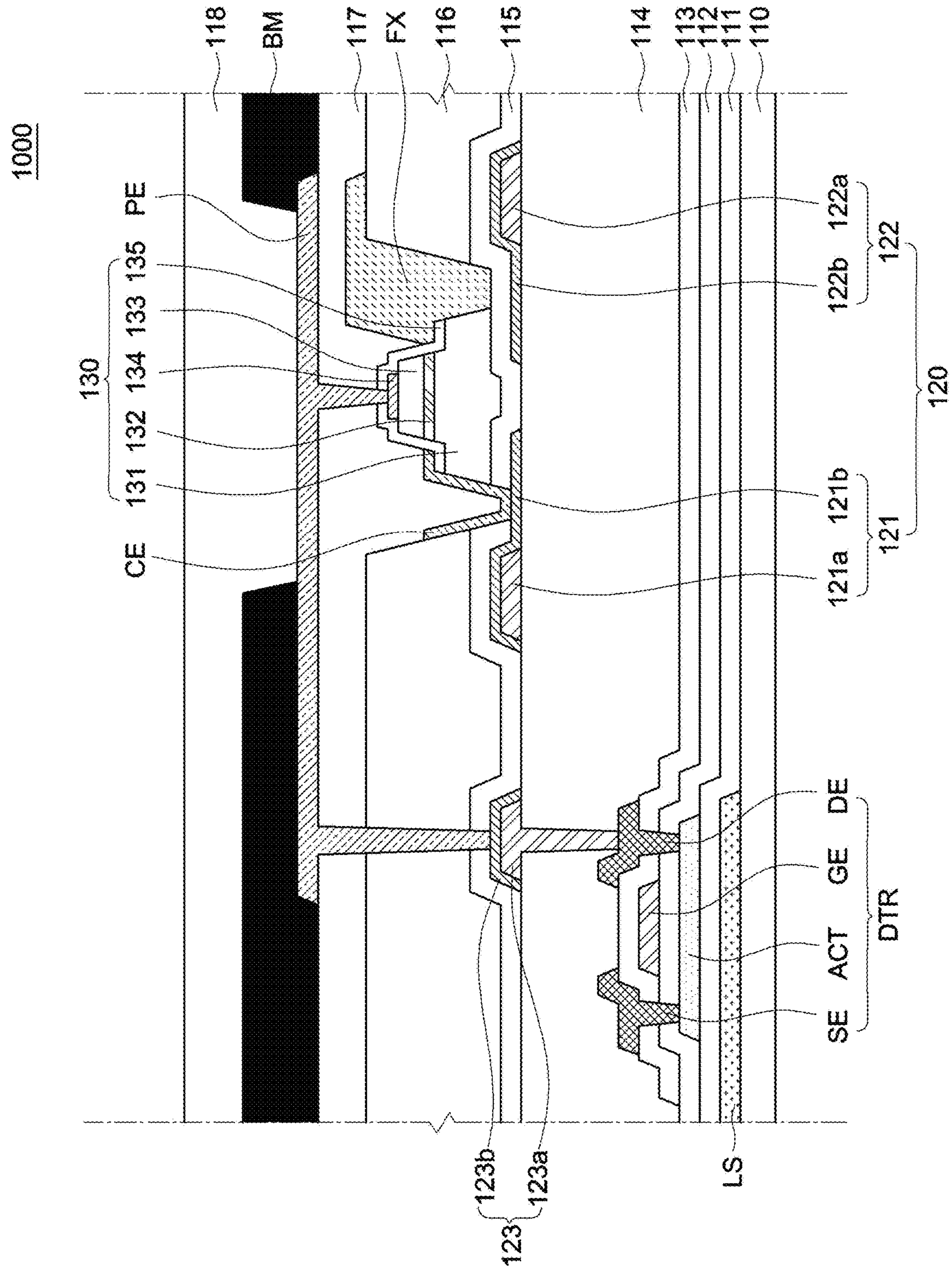

[FIG. 12A]
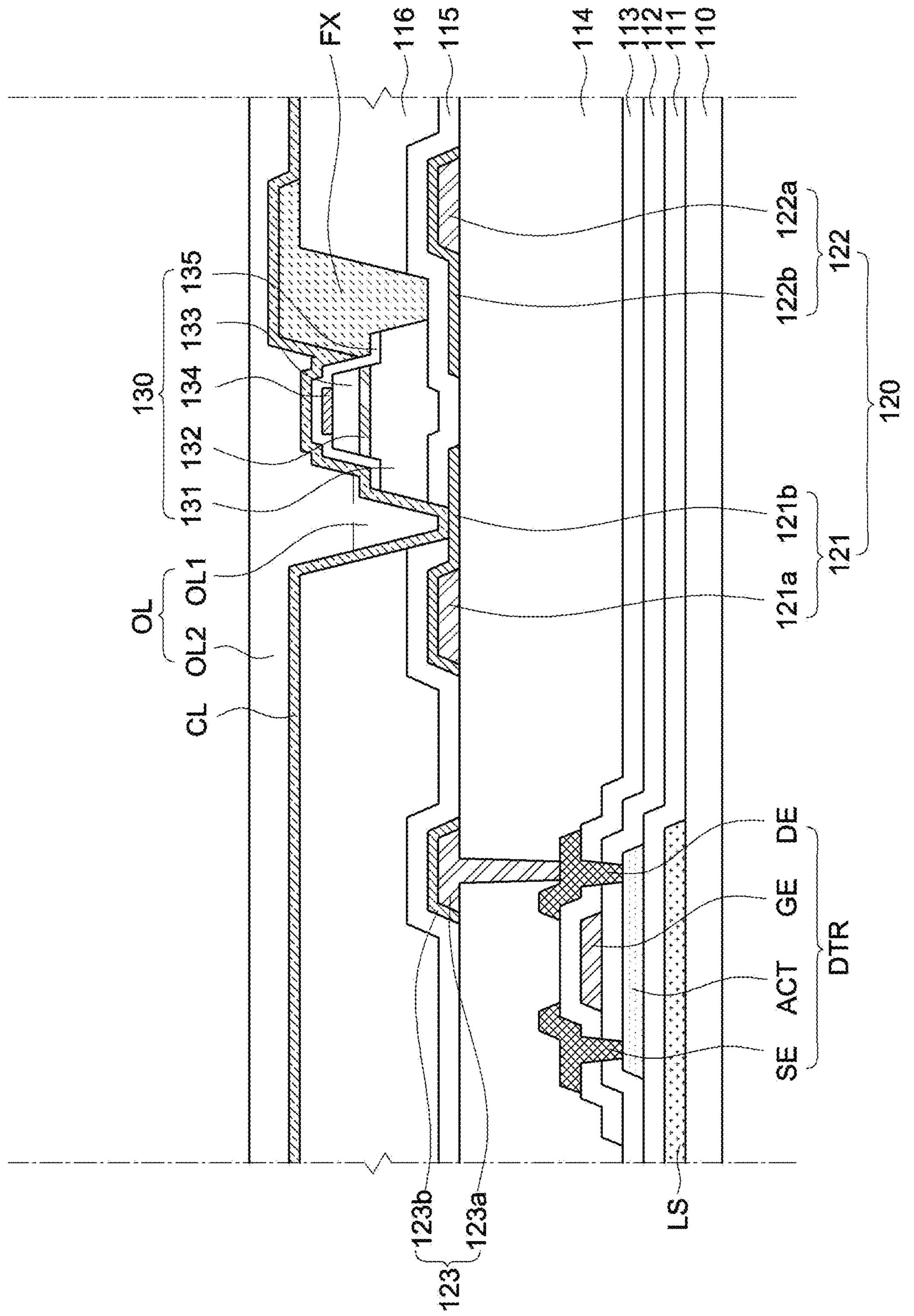

[FIG. 12B]
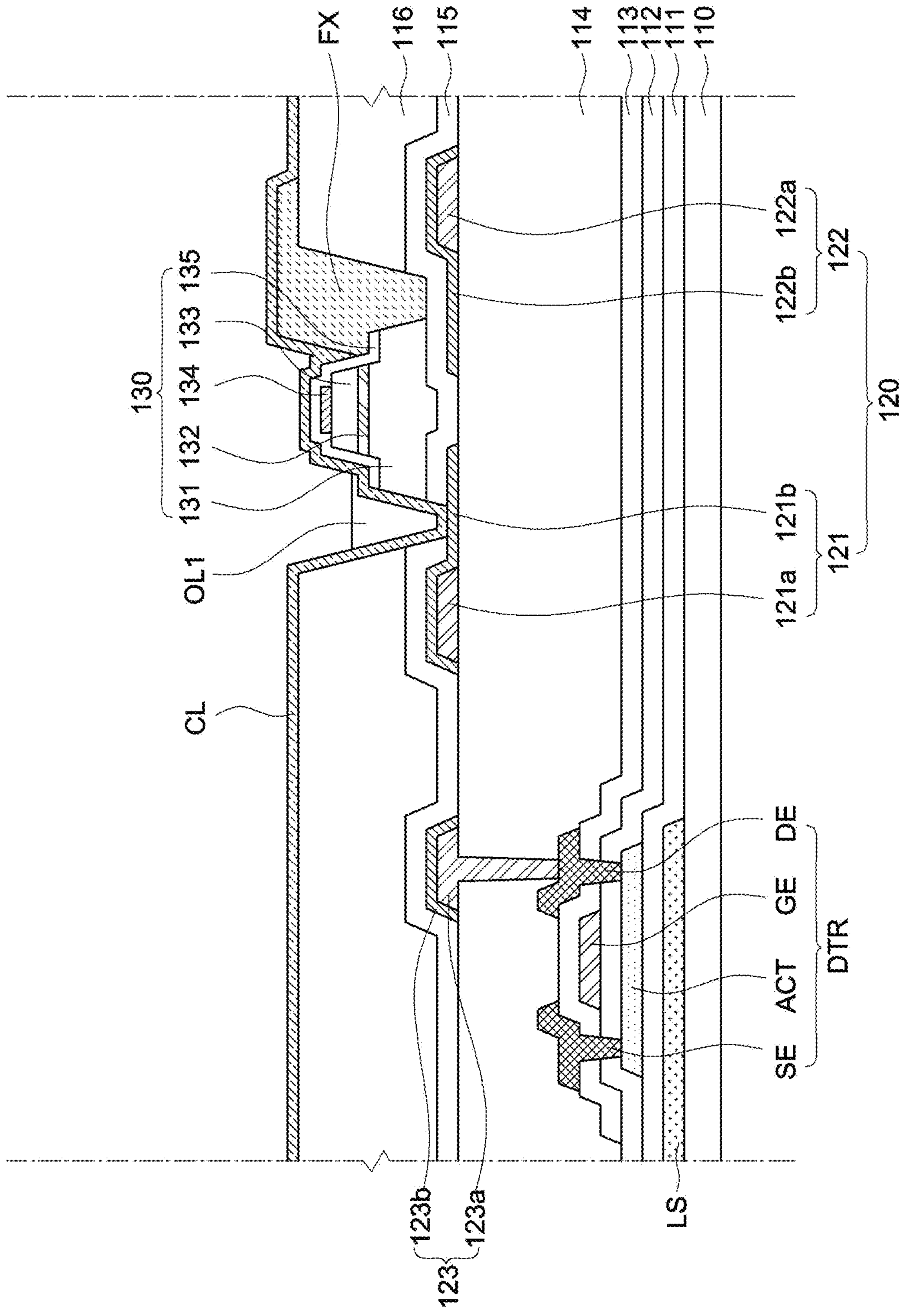

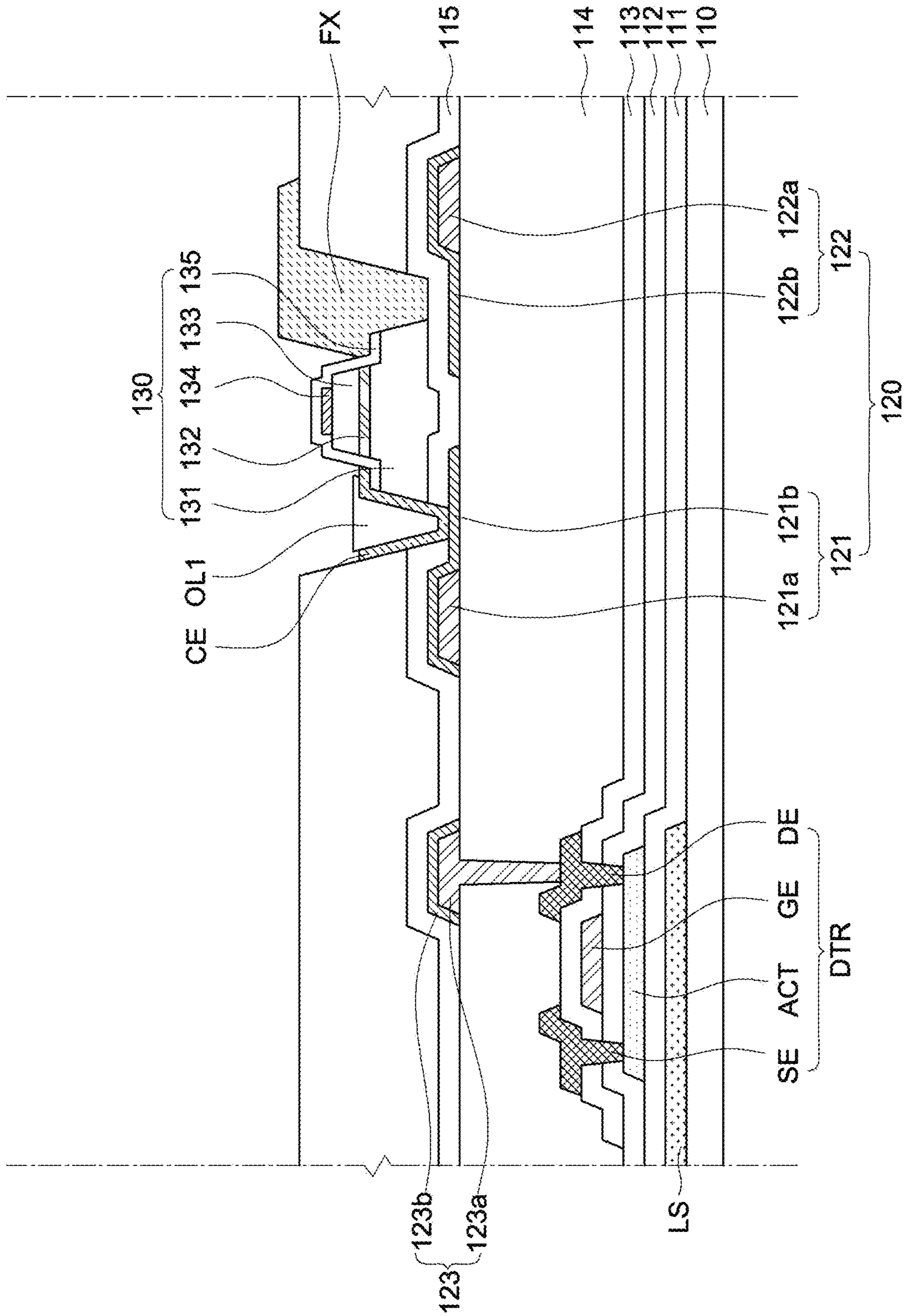
[FIG. 12C]

[FIG. 12D]
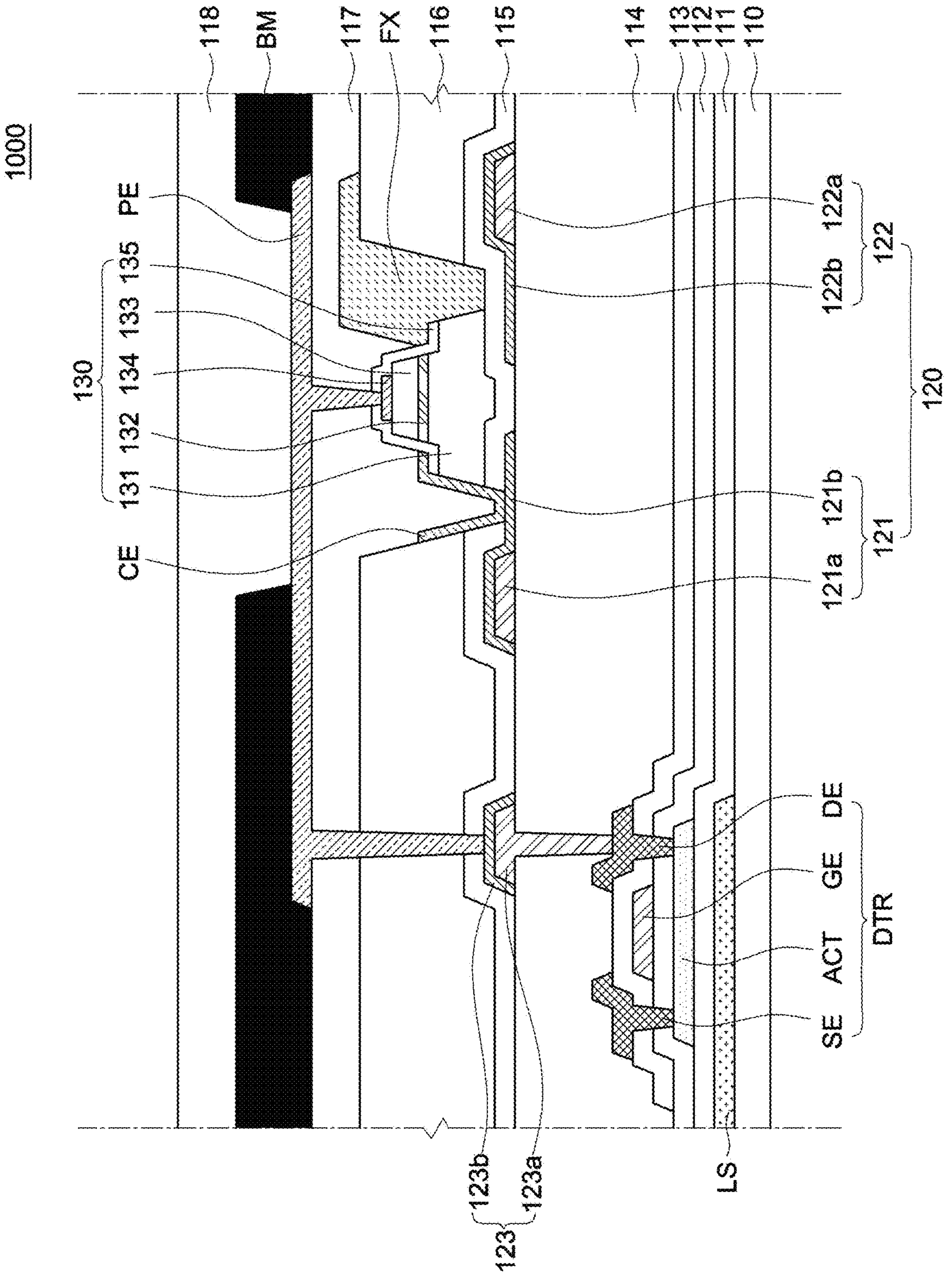

[FIG. 13]
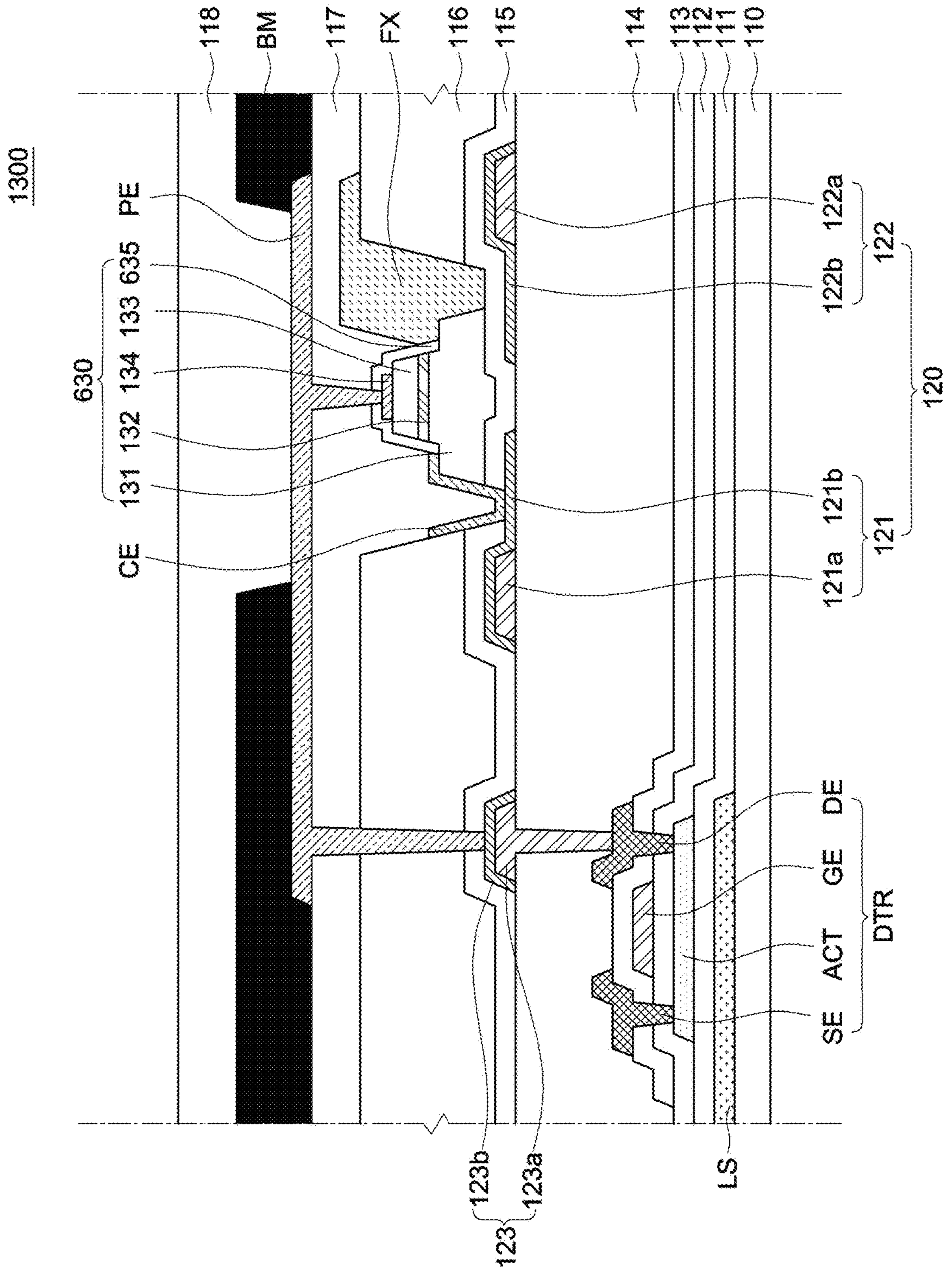

[FIG. 14]
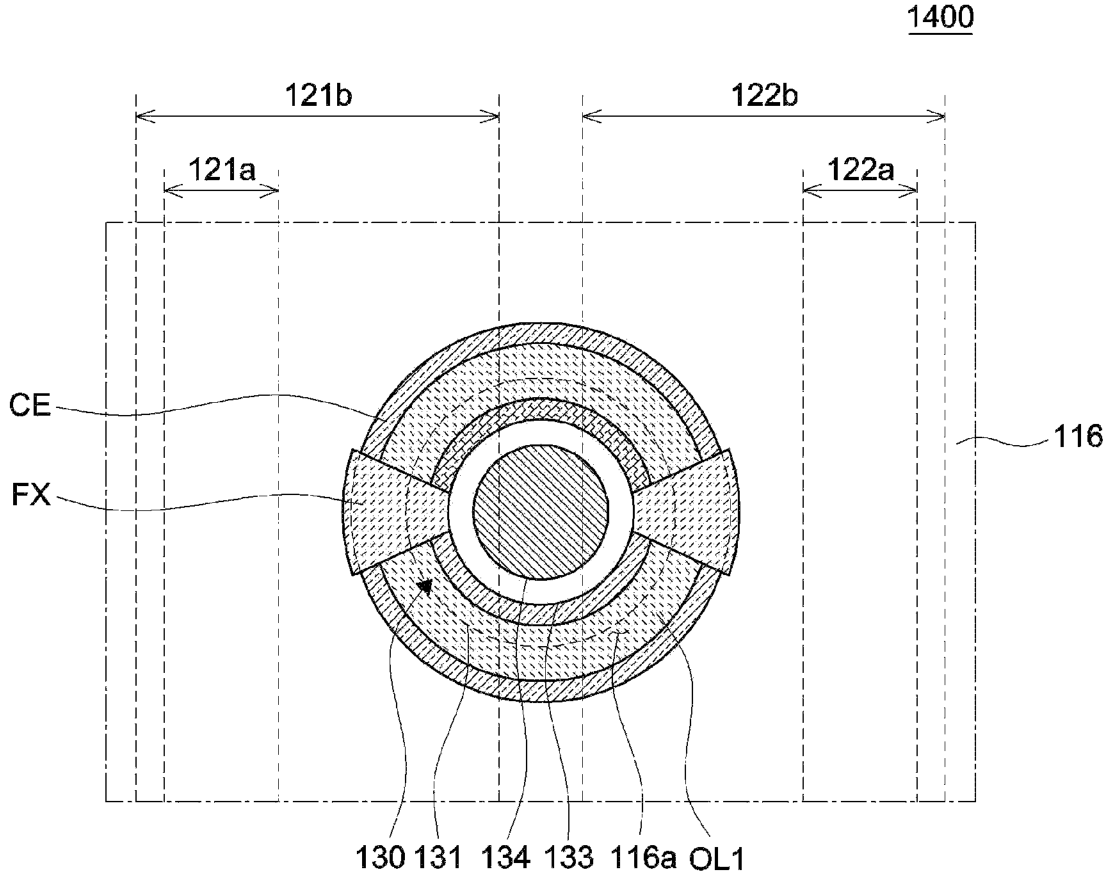

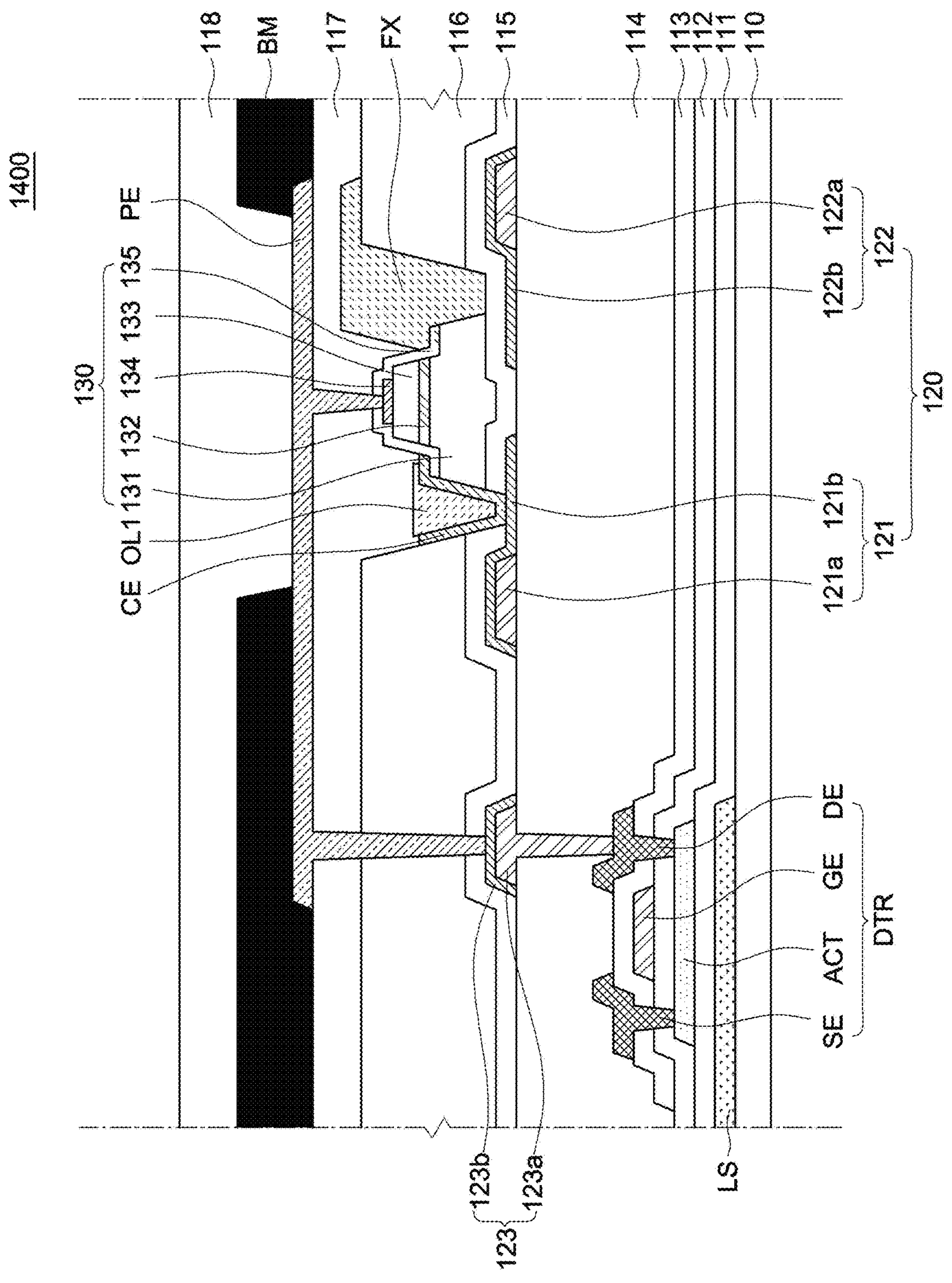
[FIG. 15]

[FIG. 16]
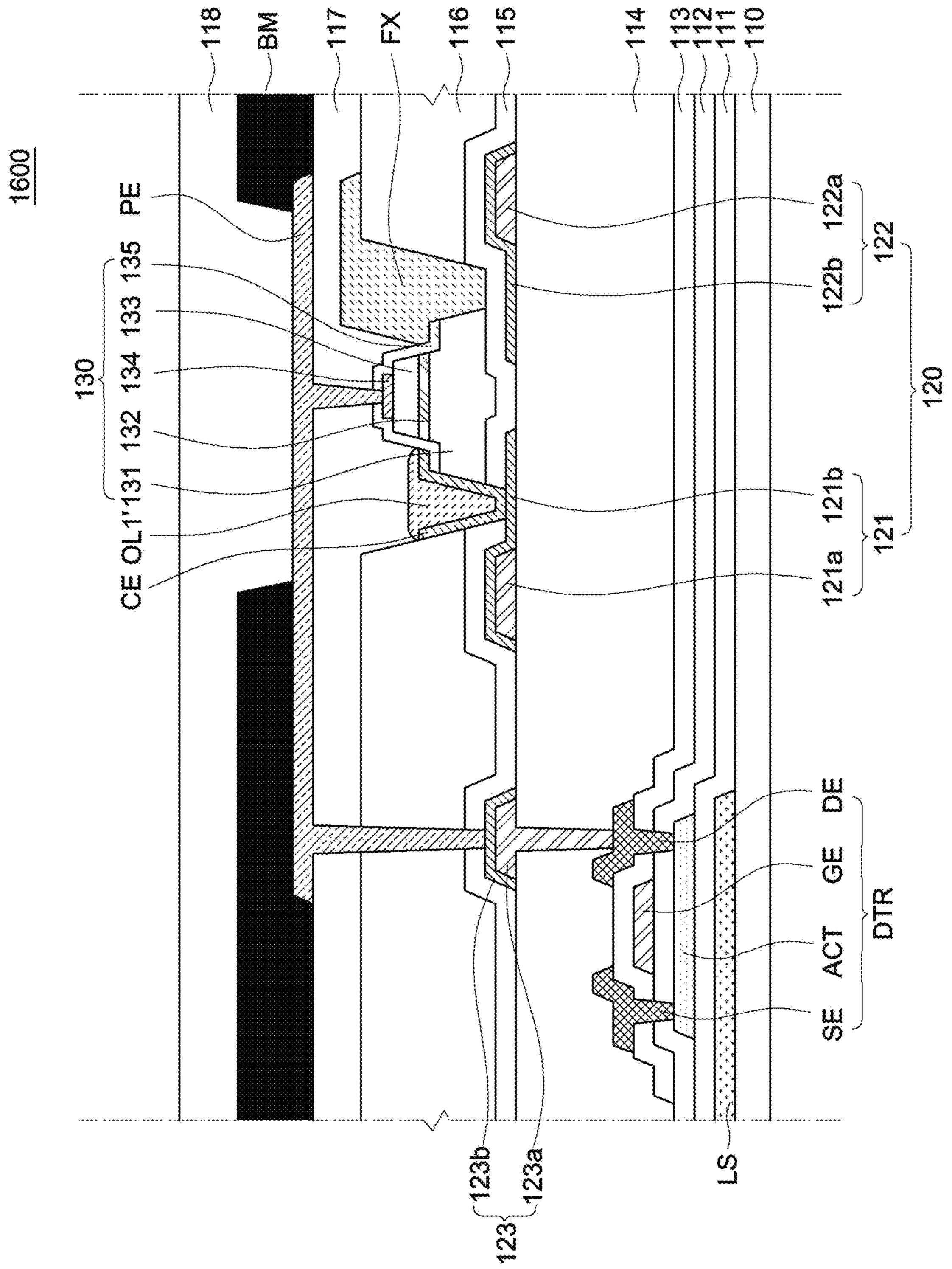

[FIG. 17]
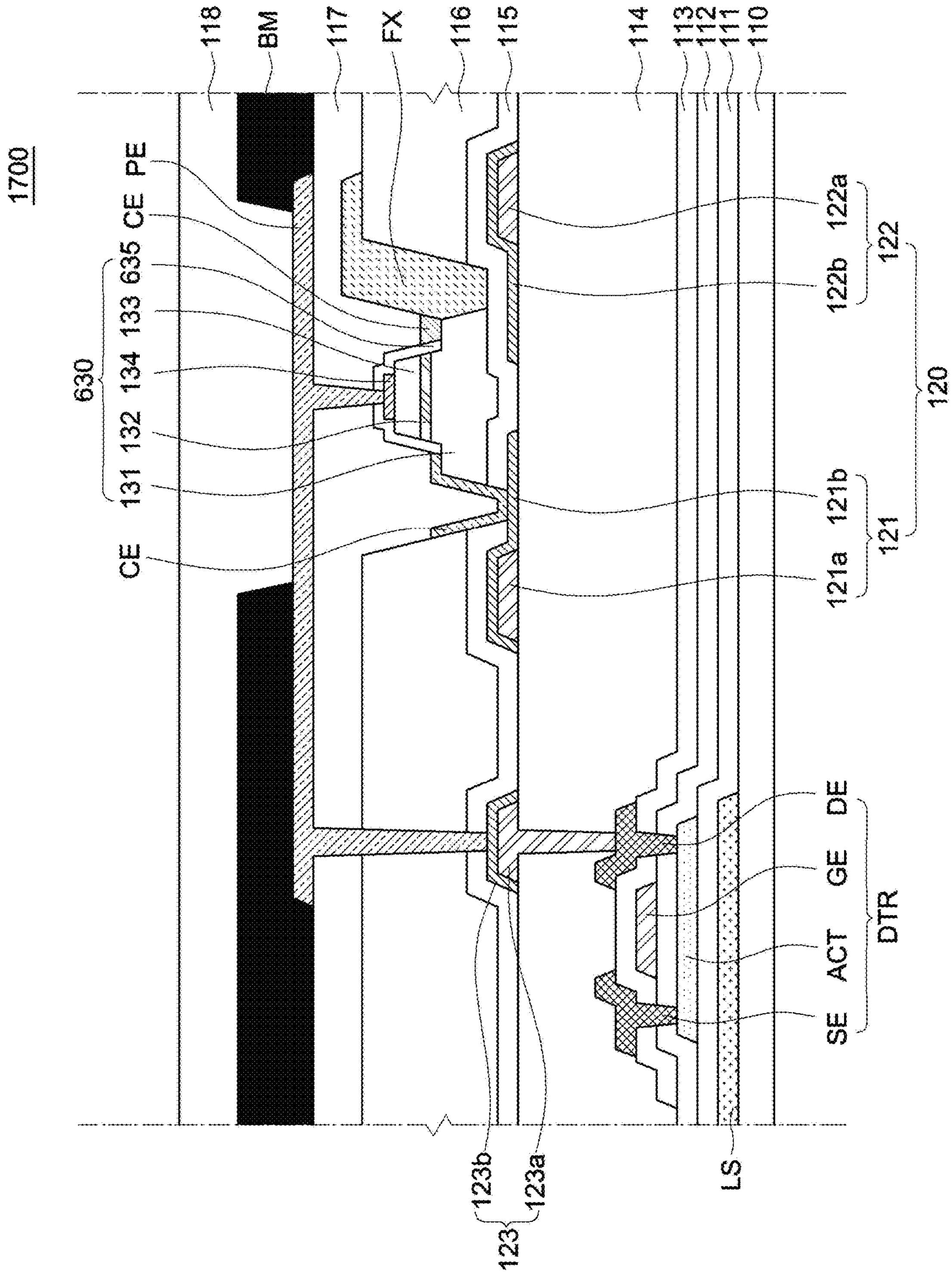

[FIG. 18]
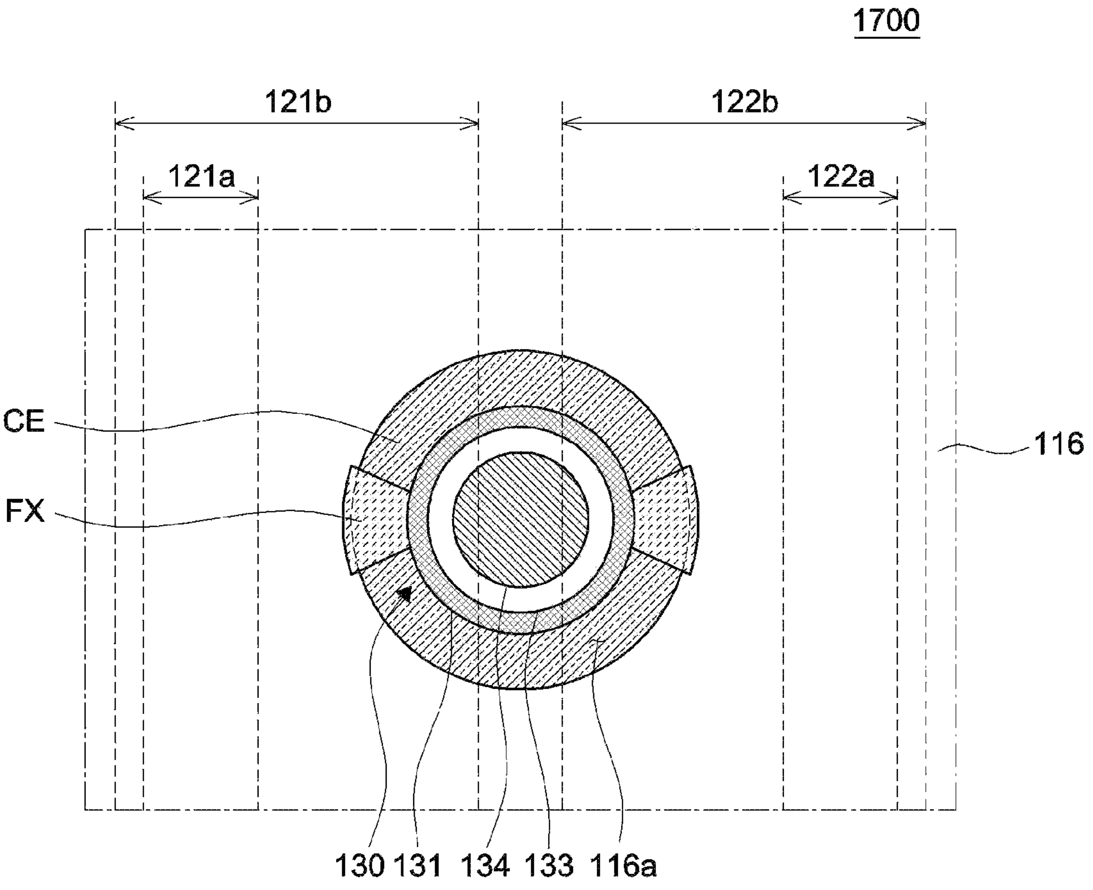

DISPLAY DEVICE COMPRISING SEMICONDUCTOR LIGHT-EMITTING ELEMENTS AND METHOD FOR MANUFACTURING SAME

CROSS REFERENCE TO RELATED APPLICATIONS

This application is the National Phase of PCT International Application No. PCT/KR2022/013143, filed on Sep. 1, 2022, which claims priority under 35 U.S.C. 119(a) to Patent Application No. 10-2021-0116485, filed in the Republic of Korea on Sep. 1, 2021, all of which are hereby expressly incorporated by reference into the present application.

TECHNICAL FIELD

The present invention relates to a display device and a manufacturing method thereof, and more specifically, to a display device using a semiconductor Light Emitting Diode and a manufacturing method thereof.

BACKGROUND ART

Display devices used in computer monitors, TVs, and mobile phones include Organic Light Emitting Display (OLED), which emits light on its own, and Liquid Crystal Display (LCD), which requires a separate light source. There are micro-LED displays, etc.

Micro-LED display is a display that uses micro-LED, a semiconductor light emitting device with a diameter or cross-sectional area of 100 μm or less, as a display device.

Micro-LED displays use micro-LED, a semiconductor light emitting device, as a display device, so they have excellent performance in many characteristics such as contrast ratio, response speed, color reproduction rate, viewing angle, brightness, resolution, lifespan, luminous efficiency, and luminance.

In particular, the micro-LED display has the advantage of being able to freely adjust the size and resolution and implement a flexible display because the screen may be separated and combined in a modular manner.

However, because large micro-LED displays require more than millions of micro-LEDs, there is a technical problem that makes it difficult to quickly and accurately transfer micro-LEDs to the display panel. Meanwhile, methods for transferring a semiconductor light emitting device to a substrate include a pick and place process, a laser lift-off method, or a self-assembly method.

Among these, the self-assembly method is a method in which a semiconductor light emitting device finds the assembly position within the fluid on its own, and is an advantageous method for implementing a large-screen display device.

Meanwhile, when a light emitting device is transferred in a fluid, there is a problem with the assembly wiring being corroded by the fluid. Corrosion of the assembly wiring may cause an electrical short circuit and cause assembly defects. Additionally, if the wiring for driving a light emitting device is not properly aligned with the light emitting device, a short circuit problem may occur.

DISCLOSURE

Technical Problem

The technical object of the embodiment provides a display device and a manufacturing method thereof that improve the assembly rate of the light emitting device by forming a contact electrode connecting the assembly wiring and the light emitting device to be self-aligned to the first semiconductor layer of the light emitting device.

In addition, the technical object of the embodiment is to provide a display device and a manufacturing method thereof that can improve the decrease in luminous efficiency due to the contact electrode by preventing the contact electrode from being formed on the second semiconductor layer.

In addition, the technical object of the embodiment is to provide a display device and a manufacturing method thereof that improve short circuit defects by forming a contact electrode so that the contact electrode is electrically connected only to the first semiconductor layer.

In addition, the technical object of the embodiment is to provide a display device and a manufacturing method thereof that minimize the occurrence of defects in the contact electrode due to external foreign substances.

In addition, the technical object of the embodiment is to provide a display device and a manufacturing method thereof that minimize the movement of the light emitting device when forming the display device.

In addition, the technical object of the embodiment is to provide a display device that minimizes corrosion of assembly wiring and a manufacturing method thereof.

In addition, the technical object of the embodiment is to provide a display device in which a pair of assembly wiring to which different voltages are applied when self-assembling a light emitting device can be used as an electrode connecting a first semiconductor layer and a driving transistor of a light emitting device, and a method of manufacturing the same.

The objects of the embodiment are not limited to the objects mentioned above, and other objects not mentioned will be clearly understood by those skilled in the art from the description below.

Technical Solution

A display device according to an embodiment may include a substrate, a first assembly wiring and a second assembly wiring arranged to be spaced apart from each other on the substrate, a planarization layer disposed on the first assembly wiring and the second assembly wiring and having an opening overlapping the first assembly wiring and the second assembly wiring, a light emitting device disposed inside the opening and including a first semiconductor layer and a second semiconductor layer on the first semiconductor layer, and a contact electrode electrically connecting the first assembly wiring, the second assembly wiring to the first semiconductor layer, The contact electrode may be in contact with a side of the first semiconductor layer, a portion of the first assembly wiring overlapping the opening, and a portion of the second assembly wiring.

In addition, an embodiment may further include a passivation layer between the first assembly wiring and the second assembly wiring and the first semiconductor layer, and wherein the passivation layer may include a contact hole exposing the first assembly wiring and the second assembly wiring at the opening.

Additionally, in an embodiment, the contact electrode may cover the side of the planarization layer at the opening.

Additionally, in an embodiment, one end of the contact electrode may contact a portion of the upper surface of the first semiconductor layer that protrudes to the outside of the second semiconductor layer.

In addition, an embodiment may further include a first part of the organic layer covering the contact electrode at the opening, and the upper surface of the first part may be disposed between the upper surface of the second semiconductor layer and the uppermost part of the contact electrode.

Additionally, in an embodiment, the organic layer may be spaced apart from the side of the planarization layer at the opening, and the uppermost part of the contact electrode may be disposed between the organic layer and the side of the planarization layer at the opening.

Additionally, in an embodiment, the organic layer may contact the side of the planarization layer at the opening, and the organic layer may cover the uppermost part of the contact electrode.

In addition, the embodiment may further include a fixing part that covers a portion of the light emitting device, a portion of the side surface of the first semiconductor layer may be in contact with the fixing part, and the remaining portion of the side surface of the first semiconductor layer may be in contact with the contact electrode.

In addition, an embodiment may further include a first part of the organic layer covering the contact electrode at the opening, and the first part and the contact electrode may surround the light emitting device together with the fixing part.

Additionally, an embodiment may further include a protective film disposed on a side of the second semiconductor layer and a portion of the upper surface of the first semiconductor layer.

Additionally, in an embodiment, one end of the contact electrode may be disposed on the protective film.

Additionally, the embodiment may further include a protective film in contact with a side surface of the second semiconductor layer and a portion of the upper surface of the first semiconductor layer.

Additionally, in the embodiment, the protective film and the fixing part are spaced apart from each other, and the contact electrode may surround the light emitting device.

Additionally, in an embodiment, the contact electrode may be disposed between the protective film and the fixing part.

In addition, a method of manufacturing a display device having a semiconductor light emitting device according to an embodiment may include a steps of self-aligning the light emitting device inside the opening of the planarization layer overlapping the first assembly wiring and the second assembly wiring, a step of sequentially forming a conductive layer and an organic layer on the planarization layer and the light emitting device, a step of ashing the organic layer to remove a second part on a first part of the organic layer; and a step of forming a contact electrode by etching the conductive layer corresponding to the second part, wherein the contact electrode is in contact with a side of a first semiconductor layer below the light emitting device.

Additionally, in an embodiment, the step of removing the second part of the organic layer may be a step of removing the second part to expose the second semiconductor layer on the upper side of the light emitting device, and a step of leaving a first part of the organic layer surrounding the first semiconductor layer below the light emitting device.

Additionally, an embodiment may further include as step of removing the first part of the organic layer after forming the contact electrode.

Additionally, an embodiment may further include a step of reflowing the first part of the organic layer, and the reflowed first part may cover the uppermost part of the contact electrode.

In addition, an embodiment may further include a step of forming a fixing part between a side portion of the planarization layer and the light emitting device at the opening, and a step of sequentially forming the conductive layer and the organic layer may be a step of sequentially forming the conductive layer and the organic layer on the fixing part, the light emitting device, and the planarization layer.

Additionally, the embodiment may include a step of sequentially forming a passivation layer and a planarization layer on the first assembly wiring and the second assembly wiring, a step of forming the opening in the planarization layer, and after self-aligning the light emitting device inside the opening, a step of forming a contact hole exposing the first assembly wiring and the second assembly wiring to the passivation layer disposed inside the opening, and wherein the contact electrode may be in contact with the first assembly wiring and the second assembly wiring exposed in the contact hole.

Advantageous Effects

According to an embodiment, there is a technical effect in that wiring for self-assembly of a light emitting device may also be used as wiring for driving the light emitting device.

In addition, an embodiment aligns the contact electrode so that it is electrically connected only to the first semiconductor layer of the light emitting device, which has the technical effect of improving short circuit defects or reduced light efficiency when the contact electrode is misaligned.

Additionally, an embodiment has the technical effect of enabling the contact electrode to be electrically insulated from the second semiconductor layer and the auxiliary electrode of the light emitting device.

Additionally, the embodiment has the technical effect of protecting the contact electrode from external foreign substances.

Additionally, the embodiment has the technical effect of stably connecting a light emitting device and a contact electrode.

Additionally, the embodiment has the technical effect of minimizing the movement of the light emitting device after self-assembly.

Additionally, the embodiment has the technical effect of minimizing corrosion and short circuit defects in a plurality of assembly wirings.

Additionally, the embodiment has the technical effect of lowering the voltage for driving a light emitting device.

The effects according to the embodiment are not limited to the contents exemplified above, and more diverse effects are included in the specification.

DESCRIPTION OF DRAWINGS

FIG. 1 is a schematic plan view of a display device according to an embodiment.

FIG. 2 is a schematic enlarged plan view of a display device according to an embodiment.

FIG. 3 is a cross-sectional view of a display device according to an embodiment.

FIGS. 4A to 4C are process views for explaining a manufacturing method of a display device according to an embodiment.

FIGS. 5A to 5E are process views for explaining the process of forming a contact electrode of a display device according to an embodiment.

FIG. 6 is a cross-sectional view of a display device according to the second embodiment.

FIG. 7 is a schematic enlarged plan view of a display device according to a third embodiment.

FIG. 8 is a cross-sectional view of a display device according to the third embodiment.

FIG. 9 is a cross-sectional view of a display device according to the fourth embodiment.

FIG. 10 is a schematic enlarged plan view of a display device according to the fifth embodiment.

FIG. 11 is a cross-sectional view of a display device according to the fifth embodiment.

FIGS. 12A to 12D are process views for explaining the manufacturing method of a display device according to the fifth embodiment.

FIGS. 13 to 16 are cross-sectional views of display devices according to sixth to eighth embodiments.

FIG. 17 is a cross-sectional view of a display device according to the ninth embodiment.

FIG. 18 is a schematic enlarged plan view of a display device according to the ninth embodiment.

MODE FOR INVENTION

Hereinafter, an embodiments disclosed in this specification will be described in detail with reference to the attached drawings. The suffixes 'module' and 'part' for components used in the following description are given or used interchangeably in consideration of ease of specification preparation, and do not have distinct meanings or roles in themselves. Additionally, the attached drawings are intended to facilitate easy understanding of the embodiments disclosed in this specification, and the technical idea disclosed in this specification is not limited by the attached drawings. Additionally, when an element such as a layer, region or substrate is referred to as being 'on' another component, this includes either directly on the other element or there may be other intermediate elements in between.

Display devices described in this specification may include digital TVs, mobile phones, smart phones, laptop computers, digital broadcasting terminals, PDAs (personal digital assistants), PMPs (portable multimedia players), navigation, slate PCs, tablet PCs, ultra-books, desktop computers, etc. However, the configuration according to the embodiment described in this specification may be applied to a device capable of displaying even if it is a new product type that is developed in the future.

Hereinafter, an embodiment will be described with reference to the drawings.

FIG. 1 is a schematic plan view of a display device according to an embodiment. In FIG. 1, for convenience of explanation, only the substrate 110 and the plurality of sub-pixels SP are shown among the various components of the display device 100.

The display device 100 according to an embodiment may include a flexible display manufactured on a thin and flexible substrate. Flexible displays may bend or curl like paper while maintaining the characteristics of existing flat displays.

In a flexible display, visual information may be implemented by independently controlling the light emission of unit pixels arranged in a matrix form. A unit pixel refers to the minimum unit for implementing one color. A unit pixel of a flexible display can be implemented by a light emitting device. In the embodiment, the light emitting device may be Micro-LED or Nano-LED, but is not limited thereto. The substrate 110 is a structure for supporting various components included in the display device 100 and may be made of an insulating material. For example, the substrate 110 may be made of glass or resin. Additionally, the substrate 110 may include polymer or plastic, or may be made of a material with flexibility.

The substrate 110 includes a display area AA and a non-display area NA.

The display area AA is an area where a plurality of sub-pixels SP are arranged and an image is displayed. Each of the plurality of sub-pixels SP is an individual unit that emits light, and a light emitting device 130 and a driving circuit are formed in each of the plurality of sub-pixels SP. For example, the plurality of sub-pixels SP may include a red sub-pixel SP, a green sub-pixel SP, a blue sub-pixel SP, and/or a white sub-pixel SP, etc., but are not limited thereto. Hereinafter, the description will be made on the assumption that the plurality of sub-pixels SP include a red sub-pixel SP, a green sub-pixel SP, and a blue sub-pixel SP, but is not limited thereto.

The non-display area NA is an area where images are not displayed, and is an area where various wiring, driver ICs, etc. for driving the sub-pixels SP arranged in the display area AA are placed. For example, various ICs such as gate driver ICs and data driver ICs and driving circuits may be placed in the non-display area NA. Meanwhile, the non-display area NA may be located on the back of the substrate 110, that is, on the side without the sub-pixel SP, or may be omitted, and is not limited to what is shown in the drawing. The display device 100 of the embodiment may drive the light emitting device in an active matrix (AM) method or a passive matrix (PM) method.

Hereinafter, FIGS. 2 and 3 will be referred to together for a more detailed description of the plurality of sub-pixels SP.

FIG. 2 is a schematic enlarged plan view of a display device according to an embodiment. FIG. 3 is a cross-sectional view of a display device according to an embodiment. Referring to FIGS. 2 and 3, the display device 100 according to the embodiment may include a substrate 110, a buffer layer 111, a gate insulating layer 112, a first passivation layer 113, a first planarization layer 114, a second passivation layer 115, a second planarization layer 116, a third planarization layer 117, a protection layer 118, a black matrix BM, light blocking layer LS, a driving transistor DTR, a semiconductor light emitting device 130, an assembly wiring 129, a connection electrode 123, an contact electrode CE, and a pixel electrode PE.

Referring to FIGS. 2 and 3, the light blocking layer LS may be disposed on the substrate 110. The light blocking layer LS blocks light incident from the bottom of the substrate 110 to the active layer ACT of the driving transistor DTR, which will be described later. Light incident from the light blocking layer LS to the active layer ACT of the driving transistor DTR is blocked, thereby minimizing leakage current.

The buffer layer 111 may be disposed on the substrate 110 and the light blocking layer LS. The buffer layer 111 may reduce the penetration of moisture or impurities through the substrate 110. The buffer layer 111 may be composed of, for example, a single layer or a multiple layer of silicon oxide (SiOx) or silicon nitride (SiNx), but is not limited thereto. However, the buffer layer 111 may be omitted depending on the type of substrate 110 or the type of transistor, but is not limited thereto.

A driving transistor DTR may be disposed on the buffer layer 111. The driving transistor DTR includes an active layer ACT, a gate electrode GE, a source electrode SE, and a drain electrode DE.

The active layer ACT may be disposed on the buffer layer 111. The active layer ACT may be made of a semiconductor material such as oxide semiconductor, amorphous silicon, or polysilicon, but is not limited thereto.

The gate insulating layer 112 may be disposed on the active layer ACT. The gate insulating layer 112 is an insulating layer to insulate the active layer ACT and the gate electrode GE, and may be composed of a single layer or multiple layers of silicon oxide (SiOx) or silicon nitride (SiNx), but is not limited thereto.

The gate electrode GE may be disposed on the gate insulating layer 112. The gate electrode GE may be electrically connected to the source electrode SE of the driving transistor DTR. The gate electrode GE may be made of a conductive material, such as copper (Cu), aluminum (Al), molybdenum (Mo), nickel (Ni), titanium (Ti), chromium (Cr), or an alloy thereof, but it is not limited thereto.

The first passivation layer 113 may be disposed on the gate electrode GE. A contact holes are formed in the first passivation layer 113 to connect the source electrode SE and the drain electrode DE to the active layer ACT. The first passivation layer 113 is an insulating layer to protect the structure underneath the first passivation layer 113, and may be composed of a single layer or multiple layers of silicon oxide (SiOx) or silicon nitride (SiNx), but is not limited thereto.

A source electrode SE and a drain electrode DE electrically connected to the active layer ACT may be disposed on the first passivation layer 113. The source electrode SE and drain electrode DE are made of a conductive material, such as copper (Cu), aluminum (Al), molybdenum (Mo), nickel (Ni), titanium (Ti), chromium (Cr) or alloy thereof, but is not limited thereto.

The first planarization layer 114 may be disposed on the driving transistor DTR. The first planarization layer 114 may planarize the upper portion of the substrate 110 on which a plurality of transistors are disposed. The first planarization layer 114 may be composed of a single layer or a double layer, and may be made of, for example, an acryl-based organic material, but is not limited thereto.

A plurality of a first assembly wirings 121, a plurality of a second assembly wirings 122, and the connection electrode 123 may be disposed on the first planarization layer 114.

First, the plurality of assembly wiring 120 generates an electric field to align the plurality of light emitting devices 130 when manufacturing the display device 100, and the plurality of assembly wirings 120 are wires that supply low-potential power voltage to the plurality of light emitting devices 130 when the display device 100 is driven. Accordingly, the assembly wiring 120 may be referred to as low-potential power wiring. A plurality of assembly wirings 120 are arranged in a column direction along a plurality of sub-pixels SP arranged on the same line. A plurality of assembly wirings 120 may be arranged to overlap a plurality of sub-pixels SP arranged in the same column. For example, one first assembly wiring 121 and a second assembly wiring 122 may be disposed in a sub-pixel SP arranged in the same column.

The plurality of assembly wirings 120 may include a plurality of first assembly wirings 121 and a plurality of second assembly wirings 122. When the display device 100 is driven, the same low-potential voltage may be applied as alternating current to the plurality of first assembly wirings 121 and the plurality of second assembly wirings 122. The plurality of first assembly wirings 121 and the plurality of second assembly wirings 122 may be alternately arranged. And, in each of the plurality of sub-pixels SP, one first assembly wiring 121 and one second assembly wiring 122 may be arranged adjacent to each other.

The plurality of first assembly wirings 121 and the plurality of second assembly wirings 122 may be made of a conductive material, for example, copper (Cu) and chromium (Cr), but are not limited thereto.

The plurality of first assembly wirings 121 may include a first conductive layer **121*a* and a first clad layer 121*b*. The first conductive layer 121*a* may be disposed on the first planarization layer 114. The first clad layer 121*b* may be in contact with the first conductive layer 121*a*. For example, the first clad layer 121*b* may be disposed to cover the upper and side surfaces of the first conductive layer 121*a*. And the first conductive layer 121*a* may have a thickness greater than that of the first clad layer 121*b***.

The first clad layer **121*b* is made of a material that is more resistant to corrosion than the first conductive layer 121*a*, there are technical effect that short circuit defects due to migration between the first conductive layer 121*a* of the first assembly wiring 121 and the second conductive layer 122*a* of the second assembly wiring 122 may be minimized when manufacturing a display device 100. For example, the first clad layer 121*b*** may be made of molybdenum (Mo), molybdenum titanium (MoTi), etc., but is not limited thereto.

Each of the plurality of second assembly wirings 122 is disposed in a plurality of sub-pixels SP arranged on the same line as described above, and a plurality of first assembly wirings 121 and a plurality of second assembly wirings 122 may be arranged to be spaced apart from each other.

Each of the plurality of second assembly wirings 122 may include a second conductive layer **122*a* and a second clad layer 122*b*. The second conductive layer 122*a* is disposed on the first planarization layer 114. And the second clad layer 122*b* may be electrically connected to the second conductive layer 122*a*. For example, the second clad layer 122*b* may be disposed to cover the upper and side surfaces of the second conductive layer 122*a*. And the second conductive layer 122*a* may have a thickness greater than that of the second clad layer 122*b***.

The second clad layer **122*b*, like the first clad layer 121*b*, is also made of a material that is more resistant to corrosion than the second conductive layer 122*a*, therefore when manufacturing display device 100, short circuit defects caused by migration between the first assembly wiring 121 and the second assembly wiring 122 may be minimize. For example, the second clad layer 122*b*** may be made of molybdenum (Mo), molybdenum titanium (MoTi), etc., but is not limited thereto.

A connection electrode 123 is disposed in each of the plurality of sub-pixels SP. The connection electrode 123 is an electrode for electrically connecting the light emitting device 130 and the driving transistor DTR, and includes a first connection layer **123*a* and a second connection layer 123*b*. The connection electrode 123 may be electrically connected to either the source electrode SE or the drain electrode DE of the driving transistor DTR through a contact hole formed in the first planarization layer 114. For example, the first connection layer 123*a* is formed of the same material in the same layer as the first conductive layer 121*a* of the first assembly wiring 121, and may be electrically connected to the driving transistor DTR through a contact hole formed in the first planarization layer 114. And the second connection layer 123***b* is formed on the same layer and made of the same material as the first clad layer 121*b*, and may cover the upper and side surfaces of the first connection layer 123*a*.

The second passivation layer 115 may be disposed on the first assembly wiring 121, the second assembly wiring 122, and the connection electrode 123. The second passivation layer 115 is an insulating layer to protect the structure underneath the second passivation layer 115, and may be composed of a single layer or multiple layers of silicon oxide (SiOx) or silicon nitride (SiNx), but is not limited thereto. In addition, the second passivation layer 115 may function as an insulating layer to prevent short circuit defects or corrosion between the first assembly wiring 121 and the second assembly wiring 122 when manufacturing the display device 100.

Next, the second planarization layer 116 may be disposed on the plurality of second assembly wirings 122. The second planarization layer 116 may be composed of a single layer or a double layer, and may be made of, for example, an acryl-based organic material, but is not limited thereto.

Meanwhile, the second planarization layer 116 includes a plurality of openings 116*a* where each of the plurality of light emitting devices 130 is placed. A plurality of openings 116*a* may be disposed in each of the plurality of sub-pixels SP. For example, one opening 116*a* may be disposed in one sub-pixel SP, but a plurality of openings 116*a* may be disposed in one sub-pixel SP, but is not limited thereto.

The plurality of openings 116*a* are parts into which the plurality of light emitting devices 130 are inserted, and may also be referred to as a pockets. The plurality of openings 116*a* may be formed to overlap the plurality of assembly wirings 120. One opening 116*a* may overlap the first assembly wiring 121 and the second assembly wiring 122 arranged adjacent to each other in one sub-pixel SP. For example, the first clad layer 121*b* of the first assembly wiring 121 and the second clad layer 121*b* of the second assembly wiring 122 may overlap the opening 116*a*.

A plurality of light emitting devices 130 may be disposed in the plurality of openings 116*a*. The plurality of light emitting devices 130 are light emitting devices 130 that emit light by electric current. The plurality of light emitting devices 130 may include light emitting devices 130 that emit red light, green light, blue light, etc., and the combination of these may produce light of various colors including white. For example, the light emitting device 130 may be a light emitting diode (LED) or a micro LED, but is not limited thereto.

The light emitting device 130 may include a first semiconductor layer 131, a light emitting layer 132, a second semiconductor layer 133, an auxiliary electrode 134, and a protective film 135.

The first semiconductor layer 131 may be disposed on the second passivation layer 115, and the second semiconductor layer 133 may be disposed on the first semiconductor layer 131. The first semiconductor layer 131 and the second semiconductor layer 133 may be layers formed by doping n-type and p-type impurities into a specific material. For example, the first semiconductor layer 131 and the second semiconductor layer 133 may include an AlInGaP-based semiconductor layer, for example, it may be a layer doped with a p-type or n-type impurity in a material such as indium aluminum phosphide (InAlP) or gallium arsenide (GaAs). In addition, the p-type impurity may be magnesium, zinc (Zn), beryllium (Be), etc., and the n-type impurity may be silicon (Si), germanium GE, tin (Sn), etc., but are not limited thereto.

Meanwhile, a portion of the first semiconductor layer 131 may be disposed to protrude outside the second semiconductor layer 133. For example, the upper surface of the first semiconductor layer 131 may be composed of a portion that overlaps the lower surface of the second semiconductor layer 133 and a portion disposed outside the lower surface of the second semiconductor layer 133. However, the size and shape of the first semiconductor layer 131 and the second semiconductor layer 133 may be changed in various ways, but are not limited thereto.

The light emitting layer 132 may be disposed between the first semiconductor layer 131 and the second semiconductor layer 133. The light emitting layer 132 may emit light by receiving holes and electrons from the first semiconductor layer 131 and the second semiconductor layer 133. The light-emitting layer 132 may be made of a single-layer or multi-quantum well (MQW) structure, and may be made of, for example, indium gallium nitride (InGaN) or gallium nitride (GaN), but is not limited thereto.

An auxiliary electrode 134 may be disposed on the second semiconductor layer 133. The auxiliary electrode 134 is an electrode that electrically connects the pixel electrode PE, which will be described later, to the second semiconductor layer 133. The auxiliary electrode 134 may be made of a transparent conductive material such as Indium Tin Oxide (ITO) or Indium Zinc Oxide (IZO), but is not limited thereto.

A protective film 135 surrounding a portion of the first semiconductor layer 131, the light emitting layer 132, and the second semiconductor layer 133 is disposed. Forming a protective film 135 to protect the first semiconductor layer 131, the light emitting layer 132, and the second semiconductor layer 133 of the light emitting device 130, and short circuit defects may be prevented when forming contact electrodes CE and pixel electrodes PE, which will be described later. For example, the protective film 135 may be arranged to cover the side and upper of the first semiconductor layer 131, the side of the light emitting layer 132, the upper surface of the first semiconductor layer 131 and the auxiliary electrode 134 protrude outside the second semiconductor layer 133. However, the protective film 135 may cover only the side surface of the second semiconductor layer 133 and the side surface of the light emitting layer 132, or may also cover a portion of the side surface of the first semiconductor layer 131, but is not limited thereto.

A contact electrode CE may be placed inside the opening 116*a*. The contact electrode CE is an electrode that electrically connects the first assembly wiring 121 and the second assembly wiring 122 overlapping the opening 116*a* with the first semiconductor layer 131 of the light emitting device 130. After forming a contact hole exposing the assembly wiring 120 in a portion of the second passivation layer 115 overlapping the opening 116*a*, by forming a contact electrode CE inside the opening 116*a*, the first semiconductor layer 131 of the light emitting device 130, the first assembly wiring 121, and the second assembly wiring 122 may be electrically connected.

The contact electrode CE may be contact with a side of the second planarization layer 116 at the opening 116*a*, the first clad layer 121*b* of the first assembly wiring 121 and the second clad layer 122*b* of the second assembly wiring 122 exposed from the second passivation layer 115 at the opening 116*a* and side of the first semiconductor layer 131. In this case, short circuit defects that occur when the contact electrode CE and the second semiconductor layer 133 are electrically connected by the protective film 135 surrounding the light emitting layer 132 and the second semiconductor layer 133 may be prevented.

Meanwhile, the contact electrode CE may be made of a conductive material, such as copper (Cu), aluminum (Al), molybdenum (Mo), nickel (Ni), titanium (Ti), chromium (Cr), or an alloy thereof. At this time, when the contact electrode CE is made of a conductive material with excellent reflection characteristics, among the light emitted from the light emitting device 130, light directed toward the side of the light emitting device 130 may be reflected toward the upper of the light emitting device 130 by the contact electrode CE, and light efficiency may be improved.

The third planarization layer 117 may be disposed on the plurality of light emitting devices 130. The third planarization layer 117 may planarize the upper part of the substrate 110 on which the plurality of light emitting devices 130 are disposed, and the plurality of light emitting devices 130 may be stably fixed inside the opening 116*a* by the third planarization layer 117. The third planarization layer 117 may be composed of a single layer or a double layer, and may be made of, for example, an acryl-based organic material, but is not limited thereto.

The pixel electrode PE may be disposed on the third planarization layer 117. The pixel electrode PE is an electrode for electrically connecting the plurality of light emitting devices 130 and the connection electrode 123. The pixel electrode PE is electrically connected to the auxiliary electrode 134 of the light emitting device 130 through a contact hole formed in the third planarization layer 117, and at the same time, may be electrically connected to the connection electrode 123 through contact holes formed in the third planarization layer 117, the second planarization layer 116, and the second passivation layer 115. Accordingly, the auxiliary electrode 134, the connection electrode 123, and the driving transistor DTR of the light emitting device 130 may be electrically connected through the pixel electrode PE.

A black matrix BM may be disposed on the third planarization layer 117. The black matrix BM may be disposed between the pluralities of sub-pixels SP on the third planarization layer 117. The black matrix BM may reduce color mixing between the pluralities of sub-pixels SP. The black matrix BM may be made of an opaque material, for example, black resin, but is not limited thereto.

A protective layer 118 is disposed on the pixel electrode PE, the third planarization layer 117, and the black matrix BM. The protective layer 118 is a layer to protect the structure below the protective layer 118, and may be composed of a single layer or multiple layers of translucent epoxy, silicon oxide (SiOx), or silicon nitride (SiNx), but is not limited thereto.

Meanwhile, a plurality of light emitting devices 130 may be self-assembled inside the opening 116*a* by a plurality of assembly wiring 120. Hereinafter, the self-assembly process of the plurality of light emitting devices 130 will be described with reference to FIGS. 4A to 4C.

FIGS. 4A to 4C are process views for explaining a method of manufacturing a display device according to an embodiment. FIGS. 4A to 4C are process views for explaining the process of self-assembling a plurality of light emitting devices 130 to the opening 116*a*.

Referring to FIG. 4A, the light emitting device 130 is introduced into the chamber CB filled with the fluid WT. The fluid WT may include water, etc., and the chamber CB filled with the fluid WT may have an open top.

Next, a ledger substrate 10 may be placed on the chamber CB filled with the light emitting device 130. The ledger substrate 10 is a substrate composed of a plurality of substrates 110 forming the display device 100 and when self-assembling a plurality of light emitting devices 130, the ledger substrate 10 formed with a plurality of assembly wiring 120 and a second planarization layer 116 may be used.

And the ledger substrate 10 formed with the first assembly wiring 121, the second assembly wiring 122, and the second planarization layer 116 is placed on the chamber CB or inserted into the chamber CB. At this time, the ledger substrate 10 may be positioned so that the opening 116*a* of the second planarization layer 116 and the fluid WT face each other.

Then, the magnet MG may be placed on the ledger substrate 10. The light emitting devices 130 that sink or float on the bottom of the chamber CB may move toward the ledger substrate 10 by the magnetic force of the magnet MG.

At this time, the light emitting device 130 may include a magnetic material to move by a magnetic field. For example, the light emitting device 130 may include a ferromagnetic material such as iron, cobalt, or nickel.

Next, referring to FIGS. 4B and 4C, the light emitting device 130, which has moved toward the second planarization layer 116 by the magnet MG, may be self-assembled to the opening 116*a* by the electric field formed by the first assembly wiring 121 and the second assembly wiring 122.

An alternating voltage may be applied to the plurality of first assembly wirings 121 and the plurality of second assembly wirings 122 to form an electric field. Due to this electric field, the light emitting device 130 may be dielectrically polarized and have polarity. And the dielectrically polarized light emitting device 130 may be moved or fixed in a specific direction by dielectrophoresis (DEP), that is, an electric field. Therefore, a plurality of light emitting devices 130 may be fixed within the opening 116*a* of the second planarization layer 116 using dielectrophoresis.

At this time, the same voltage is applied to the plurality of first assembly wirings 121 and the plurality of second assembly wirings 122 when driving the display device 100, but different voltages are applied when manufacturing the display device 100. For this, when manufacturing the display device 100, the plurality of first assembly wirings 121 and the plurality of second assembly wirings 122 may be connected to different assembly pads and different voltages may be applied.

In relation to this, referring to FIG. 4C, when manufacturing the display device 100 or self-assembling the plurality of light emitting devices 130, the plurality of assembly wirings 120 may be connected to the assembly pad. Specifically, on the ledger substrate 10, a plurality of substrates 110 forming the display device 100, a plurality of assembly pads, and a plurality of connection parts for the assembly wiring 120 are disposed.

The plurality of assembly pads are pads for applying voltage to the plurality of assembly wirings 120, and may be electrically connected to a plurality of assembly wirings 120 disposed on each of the plurality of substrates 110 forming the ledger substrate 10. The plurality of assembly pads may be formed on the ledger substrate 10 outside the substrate 110 of the display device 100, and when the manufacturing process of the display device 100 is completed, it may be separated from the substrate 110 of the display device 100. For example, voltage is applied to the plurality of first assembly wirings 121 through the first assembly pad PD1, and a voltage may be applied to the plurality of second assembly wirings 122 through the second assembly pad PD2 to form an electric field for aligning the plurality of light emitting devices 130.

At this time, the plurality of first assembly wirings 121 arranged on one substrate 110 are connected together using link wiring LL, and a plurality of second assembly wirings 122 are also connected into one, so that each of the plurality of first assembly wirings 121 and the plurality of second assembly wirings 122 may be easily connected to the assembly pad.

For example, the plurality of first assembly wirings 121 may be connected to one through a link wiring LL, and the plurality of second assembly wirings 122 may also be connected to one through a link wiring LL. In this case, instead of individually connecting each of the plurality of first assembly wirings 121 and the plurality of second assembly wirings 122 arranged on one substrate 110 to the assembly pad, by electrically connecting the link wiring LL and the assembly pad connecting each of the plurality of first assembly wirings 121 and the plurality of second assembly wirings 122 into one, a voltage for self-assembly of the light emitting device 130 may be easily applied to the plurality of first assembly wirings 121 and the plurality of second assembly wirings 122.

Therefore, after placing the ledger substrate 10 in the chamber CB into which the plurality of light emitting devices 130 are inserted, an electric field may be formed by applying an alternating voltage to a plurality of assembly wirings 120 through a plurality of assembly pads, and the plurality of light emitting devices 130 can be easily self-assembled into the opening 116*a* of the second planarization layer 116.

Meanwhile, referring to FIG. 4B, when self-assembling a plurality of light emitting devices 130, the second passivation layer 115 may be formed throughout the opening 116*a* so that the first assembly wiring 121 and the second assembly wiring 122 are not exposed to the fluid WT. While self-assembling the light emitting device 130, the second passivation layer 115 may be formed to cover the first assembly wiring 121 and the second assembly wiring 122 overlapping the opening 116*a*. Accordingly, defects such as corrosion of the first assembly wiring 121 and the second assembly wiring 122 due to exposure to the fluid WT may be prevented.

Next, the ledger substrate 10 may be flipped 180 degrees while the light emitting device 130 is fixed within the opening 116*a* using the electric fields of the plurality of first assembly wirings 121 and the plurality of second assembly wirings 122. If the ledger substrate 10 is turned over without applying voltage to the plurality of first assembly wirings 121 and the plurality of second assembly wirings 122, the plurality of light emitting devices 130 may escape from within the opening 116*a*. Therefore, the ledger substrate 10 may be turned over while voltage is applied to the plurality of first assembly wirings 121 and the plurality of second assembly wirings 122 and a subsequent process may be performed.

After the self-assembly process of the plurality of light emitting devices 130 is completed, the ledger substrate 10 can be cut along the scribing line and separated into a plurality of substrates 110. Thereafter, the same voltage may be easily applied to the plurality of first assembly wirings 121 and the plurality of second assembly wirings 122 through the link wiring LL connecting the plurality of first assembly wirings 121 into one and the link wiring LL connecting the plurality of second assembly wirings 122 into one. For example, when driving display device 100, by connecting the link wiring LL connecting each of the plurality of first assembly wirings 121 and the plurality of second assembly wirings 122 into one and the driving IC, voltage may be applied to the plurality of first assembly wirings 121 and the plurality of second assembly wirings 122.

In the display device 100 and manufacturing method of the same according to an embodiment, there is a technical effect in that at least some of the plurality of assembly wirings 120 for self-assembly of the plurality of light emitting devices 130 may be used as wiring for applying a low-potential power supply voltage to the plurality of light emitting devices 130. When manufacturing the display device 100, the plurality of light emitting devices 130 floating in the fluid WT may be moved adjacent to the ledger substrate 10 using a magnetic field.

Next, an electric field may be formed by applying different voltages to the plurality of first assembly wirings 121 and the plurality of second assembly wirings 122, and the plurality of light emitting devices 130 may be self-assembled within the plurality of openings 116*a* by an electric field. At this time, instead of separately forming a wire that supplies a low-potential voltage and connecting it to a plurality of self-assembled light emitting devices 130, by electrically connecting the plurality of assembly wirings 120 and the first semiconductor layer 131 of the light emitting device 130 through a contact electrode CE, when driving the display device 100, a plurality of assembly wirings 120 may be used as wiring to supply low-potential voltage to a plurality of light emitting devices 130.

Therefore, in the display device 100 according to the embodiment, there are technical effects that the plurality of assembly wirings 120 can be used as wiring for driving the plurality of light emitting devices 130 as well as self-assembly of the plurality of light emitting devices 130.

In the display device 100 and manufacturing method of the same according to the embodiment, a plurality of assembly wiring 120 may include a clad layers 121*b* and 122*b*, and a second passivation layer 115 is formed throughout the opening 116*a* to reduce corrosion of the plurality of assembly wirings 120 or short circuit defects. The plurality of first assembly wirings 121 are composed of a first conductive layer 121*a* and a first clad layer 121*b* that surrounds the first conductive layer 121*a* and is more resistant to corrosion than the first conductive layer 121*a*, and the plurality of second assembly wirings 122 includes a second conductive layer 122*a* and a second clad layer 122*b* that surrounds the second conductive layer 122*a* and is more resistant to corrosion than the second conductive layer 122*a*. When manufacturing the display device 100, the plurality of light emitting devices 130 may be self-assembled by placing a ledger substrate 10 on which the plurality of assembly wirings 120 are formed within the fluid WT. In this case, the first conductive layer 121*a* and/or the second conductive layer 122*a* may be exposed in the fluid WT and the assembly wiring 120 may be corroded, which may cause a short circuit defect. Therefore, the first conductive layer 121*a* of the plurality of first assembly wirings 121 may be covered with the first clad layer 121*b* and the second passivation layer 115, and the second conductive layer 122*a* of the plurality of second assembly wirings 122 may be covered with a second clad layer 122*b* and a second passivation layer 115.

Accordingly, the plurality of assembly wirings 120 are formed in a structure including a first clad layer 121*b* and a second clad layer 122*b*, while self-assembling the plurality of light emitting devices 130, the second passivation layer 115 is formed to cover the plurality of assembly wirings 120 overlapping the opening 116*a*, thus there is technical effect that can improve the reliability of the plurality of assembly wiring 120.

Meanwhile, after self-assembly of the plurality of light emitting devices 130 is completed, a contact electrode CE must be formed to connect the plurality of first assembly wirings 121 and the plurality of second assembly wirings 122 with the first semiconductor layer 131 of the light emitting device 130. At this time, the contact electrode CE may be self-aligned with the first semiconductor layer 131 of the light emitting device 130. That is, the contact electrode CE may be formed by self-aligning with the first semiconductor layer 131 of the light emitting device 130, and it is possible to prevent a short circuit between the contact electrode CE, the auxiliary electrode 134, and the pixel electrode PE due to misalignment of the contact electrode CE. This will be described later with reference to FIGS. 5A to 5E.

FIGS. 5A to 5E are process views for explaining the process of forming a contact electrode of a display device according to an embodiment.

Referring to FIG. 5A, the light emitting device 130 may be self-assembled inside the opening 116*a* as described above with reference to FIGS. 4A to 4C. The light emitting device 130 may be seated on the second passivation layer 115 disposed inside the opening 116*a*.

Referring to FIG. 5B, a contact hole CH is formed in a portion of the second passivation layer 115 disposed outside the light emitting device 130 inside the opening 116*a*. In opening 116*a*, at the space between the side of the second planarization layer 116 and the light emitting device 130, the contact hole CH exposing the first assembly wiring 121 and the second assembly wiring 122 may be formed in the second passivation layer 115. The contact hole CH may be formed in the second passivation layer 115 covering the first assembly wiring 121 and the second assembly wiring 122 to expose the first assembly wiring 121 and the second assembly wiring 122.

Next, a conductive layer CL and an organic layer OL are sequentially formed on the entire surface of the substrate 110. Specifically, the conductive layer CL may be formed to cover the second planarization layer 116, the first assembly wiring 121, the second assembly wiring 122, and the light emitting device 130, and the organic layer OL may be formed on the conductive layer CL. In particular, the conductive layer CL may be formed inside the opening 116*a* to contact the upper surface of the first assembly wiring 121 and the upper surface of the second assembly wiring 122 exposed at the contact hole CH of the second passivation layer 115. The conductive layer CL is made of copper (Cu), aluminum (Al), molybdenum (Mo), nickel (Ni), titanium (Ti), chromium (Cr) or an alloy thereof, or indium tin oxide (ITO) or indium tin oxide (IZO), and the organic layer OL may be made of an organic material such as photoresist.

Next, referring to FIG. 5C, an ashing process is performed on the organic layer OL to remove the second part OL2 of the organic layer OL. The ashing process is a process that decomposes or removes organic materials such as photoresist or polymer using plasma containing oxygen.

Through the ashing process, only the second part OL2 of the organic layer OL may be removed and the first part OL1 of the organic layer OL may be left. For example, during the ashing process, the second part OL2 of the organic layer OL is removed, and on the substrate 110, only the first part OL1 of the organic layer OL surrounding a portion of the side of the light emitting device 130 inside the opening 116*a* may remain.

In this specification, for convenience of explanation, the lower portion of the organic layer OL that is not removed during the ashing process is defined as the first part OL1, and the upper part of the organic layer OL removed during the ashing process is referred to as the second part OL2, but the present invention is not limited thereto.

Next, referring to FIG. 5D, a portion of the conductive layer CL exposed from the organic layer OL is removed through an etching process. As the second part OL2 of the organic layer OL is removed through the ashing process, a portion of the conductive layer CL may be exposed to the outside from the second part OL2 of the organic layer OL. For example, the upper surface of the second planarization layer 116 and the upper side portion of the second planarization layer 116 at the opening 116*a*, and a portion of the conductive layer CL covering the upper portion of the light emitting device 130 may be exposed from the organic layer OL.

And through the etching process, the upper surface of the second planarization layer 116 and the upper side portion of the second planarization layer 116 at the opening 116*a*, the portion of the conductive layer CL covering the upper portion of the light emitting device 130 may be removed, so that only the conductive layer CL disposed below the first part OL1 of the organic layer OL may remain. That is, the organic layer OL may function as a mask when etching the conductive layer CL, and a portion of the conductive layer CL covered with the organic layer OL may not be removed in the etching process. Accordingly, only the conductive layer CL corresponding to the first part OL1 of the organic layer OL may be left on the substrate 110 to form a contact electrode CE.

And the first part OL1 of the organic layer OL, which functions as a mask, is arranged to surround at least the first semiconductor layer 131 of the light emitting device 130, thus the conductive layer CL in contact with the side of the first semiconductor layer 131 may remain on the substrate 110 without being removed during the etching process. The upper surface of the first part OL1 may be disposed below the upper surface of the second semiconductor layer 133. Accordingly, a contact electrode CE in contact with the side surface of the first semiconductor layer 131 may be formed.

Meanwhile, the conductive layer CL may be exposed and partially etched between the upper surface of the organic layer OL and the side of the second planarization layer 116 at the opening 116*a*. For example, a portion of the conductive layer CL exposed between the upper surface of the organic layer OL and the second planarization layer 116 is removed during the etching process, so that the uppermost part of the contact electrode CE may be placed below the upper surface of the organic layer OL, and an empty space (X) may be formed between the side of the organic layer OL and the side of the second planarization layer 116 at the opening 116*a*. For example, the upper surface of the first part OL1 may be disposed between the upper surface of the second semiconductor layer 133 and the uppermost part of the contact electrode CE. However, depending on the etching process design, the uppermost part of the contact electrode CE may be formed to correspond to the upper surface of the first part OL1 of the organic layer OL, unlike as shown in FIG. 5D, but is not limited thereto.

Next, referring to FIG. 5E, after forming the contact electrode CE, the first part OL1 of the organic layer OL is removed. And, the manufacturing process of the display device 100 may be completed by sequentially forming a third planarization layer 117, a pixel electrode PE, a black matrix BM, and a protective layer 118 on the second planarization layer 116, a contact electrode CE, and a light emitting device 130.

The organic layer OL may be removed through a strip process. For example, the organic layer OL may be a photoresist, and the organic layer OL may be removed using chemicals. At this time, the organic layer OL may be formed of a material different from the second planarization layer 116. If the organic layer OL and the second planarization layer 116 are formed of the same material, the second planarization layer 116 may be damaged during the stripping process to remove the organic layer OL. Accordingly, the organic layer OL and the second planarization layer 116 may be made of different organic materials.

Internally, to form a contact electrode, a conductive layer is formed on the entire surface of the substrate on a light emitting device, a photo resist was formed to cover the side surfaces of the first semiconductor layer and expose the upper part of the light emitting device, that is, the second semiconductor layer and the auxiliary electrode. Then, the conductive layer that did not overlap the photoresist was removed to form a contact electrode. However, if the photoresist is formed to cover part of the second semiconductor layer and the auxiliary electrode due to process margins or misalignment, the conductive layer in contact with the auxiliary electrode and the second semiconductor layer is not removed, a short circuit may occur between the auxiliary electrode and the contact electrode. Additionally, the formation position of the contact electrode may become distorted, thereby hindering the progress of light emitted from the light emitting device. Accordingly, when the formation position of the contact electrode is shifted due to misalignment of the photoresist, etc., there is a problem of short circuit defects or reduced light efficiency.

In contrast, the display device 100 and the manufacturing method of the display device 100 according to the embodiment may self-align the first semiconductor layer 131 and the contact electrode CE of the light emitting device 130 through an ashing process of the organic layer OL. First, the conductive layer CL and the organic layer OL for forming the contact electrode CE may be formed on the entire surface of the substrate 110 on the light emitting device 130. Then, by performing an ashing process on the organic layer OL, the second part OL2 of the organic layer OL may be removed, leaving only the first part OL1 located inside the opening 116*a* of the organic layer OL, and the conductive layer CL covering the auxiliary electrode 134 of the light emitting device 130 and the second semiconductor layer 133 may be exposed. Then, an etching process may be performed to remove a portion of the conductive layer CL exposed from the organic layer OL, that is, a portion of the conductive layer CL covering the auxiliary electrode 134 and the second semiconductor layer 133 of the light emitting device 130. The portion of the conductive layer CL covered with the first part OL1 of the organic layer OL is not removed and remains, so that the contact electrode CE may be formed in contact with the side of the first semiconductor layer 131 and the first assembly wiring 121 and the second assembly wiring 122.

Therefore, the ashing process is performed so that only the organic layer OL surrounding the first semiconductor layer 131 of the light emitting device 130 remains inside the opening 116*a*, the remainder may be etched, leaving only the conductive layer CL in contact with the side of the first semiconductor layer 131, thus there is a technical effect of easily forming the contact electrode CE that electrically connects the first semiconductor layer 131 of the light emitting device 130 and the plurality of assembly wirings 120.

FIG. 6 is a cross-sectional view of a display device according to a second embodiment. The display device 600 of FIG. 6 may adopt the features of the first embodiment. For example, there is a technical effect in that the contact electrode CE contacts the first semiconductor layer 131 to electrically connect the first semiconductor layer 131 and the plurality of assembly wirings 120. Hereinafter, the description will focus on the shape of the protective film 635 and the contact electrode CE.

Referring to FIG. 6, a light emitting device 630 includes a protective film 635. The protective film 635 is disposed to cover the side of the light emitting layer 132, the upper and side surfaces of the second semiconductor layer 133, and the upper of the auxiliary electrode 134. At this time, the protective film 635 is not formed on a portion of the upper surface of the first semiconductor layer 131 that protrudes outside the light emitting device 630 and the second semiconductor layer 133. A portion of the upper surface and side surfaces of the first semiconductor layer 131 protruding outside the light emitting layer 132 and the second semiconductor layer 133 may be exposed from the protective film 635.

The contact electrode CE is disposed to cover the side of the first semiconductor layer 131 and a portion of the upper surface of the first semiconductor layer 131 exposed from the protective film 635. The contact electrode CE may be electrically connected to the first semiconductor layer 131 by contacting the side surface of the first semiconductor layer 131 and the portion of the upper surface of the first semiconductor layer 131.

Therefore, in the display device 600 according to the second embodiment, the first semiconductor layer 131 is exposed as much as possible from the protective film 635 to secure the contact area between the first semiconductor layer 131 and the contact electrode CE, thus there is a technical effect of stably connecting the light emitting device 630 and the contact electrode CE.

The protective film 635 covers the second semiconductor layer 133, the light emitting layer 132, and the auxiliary electrode 134, and does not cover the portion of the upper surface and side surfaces of the first semiconductor layer 131 protruding outside the second semiconductor layer 133 and the light emitting layer 132. And the contact electrode CE may be in contact with the upper and side surfaces of the first semiconductor layer 131 protruding outside the second semiconductor layer 133 and the light emitting layer 132. If the adhesion between the side of the first semiconductor layer 131 and the contact electrode CE is reduced due to a high temperature process during the manufacturing process of the display device 600, and the contact electrode CE is lifted, it may lead to defects. However, as the contact electrode CE is formed to contact the upper surface of the first semiconductor layer 131, the contact area between the contact electrode CE and the first semiconductor layer 131 increases, and the contact electrode CE and the first semiconductor layer 131 may be stably connected.

Therefore, in the display device 600 according to the second embodiment, the contact area between the first semiconductor layer 131 and the contact electrode CE is improved, thus there is a technical effect of stably fixing the light emitting device 630 and the contact electrode CE.

FIG. 7 is a schematic enlarged plan view of a display device according to a third embodiment. FIG. 8 is a cross-sectional view of a display device according to a third embodiment. The third embodiment may adopt the features of the first embodiment. For example, the contact electrode CE has the technical effect of being able to connect the first semiconductor layer 131 and the assembly wiring 120 by contacting the first semiconductor layer 131. Hereinafter, the description will focus on the organic layer OL.

Referring to FIGS. 7 and 8, the first part OL1 of the organic layer OL is disposed inside the opening 116*a*. The first part OL1 of the organic layer OL may be arranged to cover the contact electrode CE inside the opening 116*a*. The first part OL1 of the organic layer OL may fill the space between the portion of the contact electrode CE covering the side of the second planarization layer 116 and the portion of the contact electrode CE covering the side of the first semiconductor layer 131 of the light emitting device 130 in the opening 116*a*. Except for the uppermost part of the contact electrode CE, all remaining parts of the contact electrode CE may be covered with the first part OL1 of the organic layer OL. The upper surface of the first part OL1 may be disposed between the upper surface of the second semiconductor layer 133 and the uppermost part of the contact electrode CE.

Meanwhile, the first part OL1 of the organic layer OL may be the first part OL1 of the organic layer OL formed on the entire surface of the substrate 110 to form a contact electrode CE. For example, as described above in FIGS. 5C and 5D, a conductive layer CL and an organic layer OL are sequentially formed on the entire surface of the substrate 110 to form a contact electrode CE, and by performing the ashing process, the first part OL1 of the organic layer OL may be left only inside the opening 116*a*. Afterwards, an etching process may be performed to remove the remaining part of the conductive layer CL that is not covered by the first part OL1 of the organic layer OL, and a contact electrode CE may be formed. Finally, without removing the first part OL1 of the organic layer OL, the third planarization layer 117, pixel electrode PE, bank, and protective layer 118 are sequentially formed on the first part OL1 of the organic layer OL, thus, the display device 700 of FIGS. 7 and 8 may be formed.

At this time, since the first part OL1 of the organic layer OL is not removed through the strip process, the first part OL1 of the organic layer OL may be formed of the same material as the second planarization layer 116. However, the organic layer OL may be made of a different material from the second planarization layer 116, but is not limited thereto.

In the display device 700 according to the third embodiment, the contact electrode CE may be protected by leaving the first part OL1 of the organic layer OL used when forming the contact electrode CE without removing it. When forming a contact electrode CE, the organic layer OL is formed on the entire surface of the substrate 110, and the ashing process is performed to leave only the first part OL1 of the organic layer OL inside the opening 116*a*. Then, an etching process is performed to form the contact electrode CE by leaving only the first part OL1 of the organic layer OL and the corresponding conductive layer CL.

At this time, the contact electrode CE may be protected by leaving the first part OL1 of the organic layer OL as is without removing it. For example, conductive foreign substances connecting the contact electrode CE and the upper part of the light emitting device 130, for example, the second semiconductor layer 133 or the auxiliary electrode 134 may be generated when the first part OL1 of the organic layer OL is removed and the contact electrode CE is exposed. In this case, a short circuit may occur between the contact electrode CE and the upper portion of the light emitting device 130 due to conductive foreign substances.

Therefore, in the display device 700 according to the third embodiment, when forming a contact electrode CE, there is a technical effect in protecting the contact electrode CE from external foreign substances by leaving the first part OL1 of the organic layer OL covering the contact electrode CE intact without removing it.

FIG. 9 is a cross-sectional view of a display device according to a fourth embodiment. The fourth embodiment may adopt the features of the third embodiment. For example, the contact electrode CE is in contact with the first semiconductor layer 131, and the first part OL1 of the organic layer may cover the contact electrode CE. Hereinafter, the description will focus on the form of the first part OL1 of the organic layer OL.

Referring to FIG. 9, the first part OL1' of the organic layer OL may be in contact with the side of the second planarization layer 116 and the protective film 135 of the light emitting device 130 at the opening 116*a* on the uppermost of the contact electrode CE so as to cover the uppermost part of the contact electrode CE. All empty spaces between the first part OL1' of the organic layer OL and the side of the second planarization layer 116 in the first opening 116*a* and between the first part OL1' of the organic layer OL and the protective film 135 may be filled with the first part OL1'.

The first part OL1' of the organic layer OL may be reflowed to cover all of the contact electrodes CE. For example, as shown in FIG. 5D, when heat is applied while the first part OL1 of the organic layer OL is formed, the first part OL1 of the organic layer OL has fluidity, and the upper side of the first part OL1 partially may flows and spreads to the left and right. The reflowed first part OL1' has an upper side flowing down, an empty space between the side of the second planarization layer 116 and the organic layer OL at the opening 116*a*, and an empty space between the organic layer OL and the protective film 135, for example, the X area shown in FIG. 5D may be filled. Accordingly, by performing a reflow process, the shape of the first part OL1' of the organic layer OL may be modified so that the first part OL1' covers the entire contact electrode CE.

Therefore, in the display device 900 according to the fourth embodiment, a reflow process can be performed so that the first part OL1' of the organic layer OL has a structure that covers all of the contact electrodes CE. Before proceeding with the reflow process, in the empty space between the first part OL1 of the organic layer OL and the side of the second planarization layer 116 and between the first part OL1 of the organic layer OL and the light emitting device 130, the uppermost part of the contact electrode CE may be partially exposed. And through the reflow process, the first part OL1' of the organic layer OL may be made to have fluidity, and the first part OL1' of the organic layer OL having fluidity may flow down to cover the uppermost part of the contact electrode CE. Therefore, the first part OL1' of the organic layer OL may be formed to completely cover the contact electrode CE to prevent the contact electrode CE from being exposed to the outside.

Accordingly, in the display device 900 according to the fourth embodiment, as the first part OL1' of the organic layer OL is reflowed to form a structure that completely covers the contact electrode CE, the contact electrode CE may be protected from the outside, thus there is a complex technical effect that can prevent short circuits between the contact electrode CE and other components.

FIG. 10 is a schematic enlarged plan view of a display device according to a fifth embodiment. FIG. 11 is a cross-sectional view of a display device according to the fifth embodiment. The display device 1000 according to the fifth embodiment may adopt the features of the first embodiment. For example, the contact electrode CE is in contact with the first semiconductor layer 131 and can be electrically connected to the first semiconductor layer 131 and the assembly wiring 120. Hereinafter, the description will focus on the fixing part FX.

Referring to FIGS. 10 and 11, a fixing part FX that fixes a portion of the light emitting device 130 is disposed in the opening 116*a*. The fixing part FX is arranged to cover a portion of the light emitting device 130 inside the opening 116*a*. And the side of the first semiconductor layer 131 of the light emitting device 130 may be composed of a portion in contact with the fixing part FX and a portion in contact with the contact electrode CE. For example, as shown in FIG. 10, the fixing part FX may be arranged to cover the left and right portions of the light emitting device 130, the fixing part FX may cover only one part of the light emitting device 130, and the location and number of fixing parts FX are not limited thereto.

A portion of the fixing part FX may be disposed to extend to the upper surface of the second planarization layer 116. For example, the fixing part FX may cover the upper surface of the second planarization layer 116, the side of the second planarization layer 116 at the opening 116*a*, and a portion of the light emitting device 130. However, the fixing part FX may be placed only inside the opening 116*a*, but is not limited thereto.

Before forming the contact electrode CE and the third planarization layer 117 on the light emitting device 130 self-assembled on the substrate 110, the fixing part FX has technical effect of preventing the light emitting device 130 from moving Hereinafter, a method of manufacturing the display device 1000 including the fixing part FX will be described with reference to FIGS. 12A to 12D.

FIGS. 12A to 12D are process views for explaining the manufacturing method of a display device according to the fifth embodiment.

Referring to FIG. 12A, the light emitting device 130 is self-assembled inside the opening 116*a* using a plurality of first assembly wirings 121 and a plurality of second assembly wirings 122. And forms a fixing part FX that covers a portion of the light emitting device 130. The fixing part FX may be formed inside the opening 116*a* to contact a portion of the light emitting device 130. And the edge of the fixing part FX may extend outside the opening 116*a* and be formed on the upper surface of the second planarization layer 116.

Then, by forming a contact hole CH in the second passivation layer 115 disposed outside the light emitting device 130 inside the opening 116*a*, the first assembly wiring 121 and the second assembly wiring 122 may be exposed. And, a conductive layer CL and an organic layer OL are sequentially formed on the entire surface of the substrate 110 on the fixing part FX and the light emitting device 130. The conductive layer CL and the organic layer OL may be formed to cover the fixing part FX, the light emitting device 130, and the second planarization layer 116, and the conductive layer CL may be in contact with the first assembly wiring 121 and the second assembly wiring 122 through the contact hole CH formed inside the opening 116*a*.

Next, referring to FIG. 12B, the ashing process is performed to remove the second part OL2 of the organic layer OL, and inside the opening 116*a*, only the lower part of the light emitting device 130, for example, the first part OL1 of the organic layer OL surrounding the first semiconductor layer 131 of the light emitting device 130, is left. Therefore, through the ashing process, only the first part OL1 of the organic layer OL surrounding the first semiconductor layer 131 of the light emitting device 130 may remain inside the opening 116*a*.

Next, referring to FIG. 12C, an etching process is performed to remove the conductive layer CL. During the etching process, a portion of the conductive layer CL exposed from the first part OL1 of the organic layer OL may be removed, and the portion of the conductive layer CL covered with the first part OL1 of the organic layer OL may not be removed. Therefore, the part of the conductive layer CL that was not removed by the first part OL1 of the organic layer OL may become the contact electrode CE connecting the first semiconductor layer 131 of the light emitting device 130 and the first assembly wiring 121 and the second assembly wiring 122.

Finally, referring to FIG. 12D, the first part OL1 of the organic layer OL is removed. And a third planarization layer 117, a pixel electrode PE, a black matrix BM, and a third planarization layer 117, a pixel electrode PE, a black matrix BM, and a protective layer 118 on the second planarization layer 116 are formed sequentially.

In the display device 1000 and its manufacturing method according to the fifth embodiment, after self-assembling the light emitting device 130 on the substrate 110, a fixing part FX may be formed to fix the light emitting device 130 so that the light emitting device 130 does not move in a later process. After self-assembling the light emitting device 130 inside the opening 116*a*, a contact electrode CE, a third planarization layer 117, a pixel electrode PE, etc. may be formed on the light emitting device 130. However, in the process of forming a contact electrode CE, etc. on the light emitting device 130, the light emitting device 130 may not be fixed and may move.

To prevent this, a fixing part FX may be formed in advance before proceeding with the process of forming a contact electrode CE, etc. on the light emitting device 130. The fixing part FX is arranged to cover a portion of the light emitting device 130 and may fix the light emitting device 130 inside the opening 116*a*. Therefore, even if post-processing is performed on the self-assembled light emitting device 130, the light emitting device 130 may not move due to the fixing part FX.

Therefore, in the display device 1000 and its manufacturing method according to the fifth embodiment, there is a technical effect of preventing the light emitting device 130 from moving during the manufacturing process of the display device 1000 by forming a fixing part FX that fixes the self-assembled light emitting device 130.

FIGS. 13 to 16 are cross-sectional views of display devices according to a sixth to eighth embodiments. Each of the display devices 1300, 1400, 1600 of FIGS. 13 to 16 further includes a fixing part FX compared to the display devices 600, 700, 900 of FIGS. 6, 7, 8, and 9, respectively, and the description will focus on this.

The fixing part FX described in the display device 1000 of FIGS. 10 and 11 may be applied to the display devices 1300, 1400, and 1600 according to the sixth to eighth embodiments.

For example, the display device 1300 of FIG. 13 may be formed by applying a fixing part FX to the display device 600 of FIG. 6. Specifically, the protective film 635 of the light emitting device 630 may not cover the upper surface of the first semiconductor layer 131 protruding outside the light emitting layer 132 and the second semiconductor layer 133. A light emitting device 630 whose protective film 635 does not cover the upper surface of the first semiconductor layer

131 may be self-assembled on the substrate 110, and a fixing part FX can be formed on the self-assembled light emitting device 630.

Afterwards, a contact electrode CE may be formed by forming a conductive layer CL and an organic layer OL on the light emitting device 630 and the fixing part FX. In this case, a contact electrode CE may not be formed in the part of the light emitting device 630 that is in contact with the fixing part FX. The fixing part FX may be arranged to surround the light emitting device 630 along with the contact electrode CE. Accordingly, a portion of the upper surface of the first semiconductor layer 131 exposed from the protective film 635 may be in contact with the contact electrode CE, and the other portion may be in contact with the fixing part FX.

For another example, the display device 1400 of FIGS. 14 and 15 may be formed by applying a fixing part FX to the display device 700 of FIGS. 7 and 8. Specifically, forming a fixing part FX on the self-assembled light emitting device 130, and a contact electrode CE and an organic layer OL may be formed by forming an organic layer OL and a conductive layer CL on the fixing part FX. At this time, the organic layer OL can be formed by leaving the first part OL1 of the organic layer OL without removing it. A contact electrode CE and an organic layer OL may not be formed in a portion of the light emitting device 130 corresponding to the fixing part FX. The fixing part FX surrounds the light emitting device 130 with a contact electrode CE, and the fixing part FX may fill the space between the side of the second planarization layer 116 and the light emitting device 130 in the opening **116*a*** together with the organic layer OL.

For another example, the display device 1600 of FIG. 16 may be formed by applying a fixing part FX to the display device 900 of FIG. 9. With the fixing part FX formed on the self-assembled light emitting device 130, the contact electrode CE and the first part OL1' of the organic layer OL may be formed. And the first part OL1' of the organic layer OL may be reflowed to cover the entire uppermost part of the contact electrode CE. Accordingly, when looking at the opening **116*a* on a plane, the upper part of the contact electrode CE is not exposed to the outside by the first part OL1'. Therefore, when looking at the opening 116*a* on a plane, inside the opening 116*a*, the light emitting device 130 and the first part OL1' and the fixing part FX of the organic layer OL surrounding the light emitting device 130** may be seen to be disposed.

Therefore, in the display devices 1300, 1400 and 1600 according to the sixth to eighth embodiments, by applying a fixing part FX to the display devices 600, 700 and 900 of various structures, the self-assembled light emitting devices 130 and 630 may be prevented from moving.

For example, referring to FIG. 13, after self-assembling the light emitting device 630 from which the protective film 635 covering the upper surface of the first semiconductor layer 131 has been removed, on the substrate 110, the light emitting device 630 may be fixed by forming a fixing part FX. Then, a contact electrode CE is formed while the light emitting device 630 is fixed with a fixing part FX, thus the first semiconductor layer 131 of the light emitting device 630 may be electrically connected to the assembly wiring 120 and the driving transistor DTR.

For example, referring to FIG. 15, after self-assembling the light emitting device 130 on the substrate 110, a fixing part FX can be formed to fix the light emitting device 130. Then, while the light emitting device 130 is fixed, a contact electrode CE and an organic layer OL are formed, thus the light emitting device 130 may be connected to the driving transistor DTR and the contact electrode CE may be protected from external foreign substances.

For example, referring to FIG. 16, after fixing the self-assembled light emitting device 130 with the fixing part FX, forming a first part OL1' of a contact electrode CE and an organic layer OL, by reflowing the first part OL1' of the organic layer OL, the uppermost part of the contact electrode CE may be prevented from being exposed to the outside, and the contact electrode CE may be protected from foreign substances. Therefore, in the display devices (1300, 1400, 1600) according to the sixth to eighth embodiments, by applying fixing parts FX to display devices 600, 700 and 900 of various structures, the light emitting device 130 and 630 may be prevented from flowing when forming a contact electrode CE, organic layer OL, third planarization layer 117, etc. on a self-assembled light emitting device 130 and 630.

Next, FIGS. 17 and 18 are a cross-sectional view and a schematic enlarged plan view of the display device 1700 according to a ninth embodiment. The display device 1700 according to the ninth embodiment may adopt the features of the first embodiment. For example, the contact electrode CE is in contact with the first semiconductor layer 131 and may be electrically connected to the first semiconductor layer 131 and the assembly wiring 120. Hereinafter, the description will focus on the modified form of the contact electrode CE and fixing part FX.

Referring to FIGS. 17 and 18, the display device 1700 according to the ninth embodiment may form a fixing part FX on the self-assembled light emitting device 630. In detail, the fixing part FX may be formed to be spaced apart from the protective film 635 formed on a portion of the upper surface of the first semiconductor layer 131. Additionally, a contact electrode CE may be additionally formed in an area of the upper surface of the first semiconductor layer 131 where the protective film 635 and the fixing part FX are spaced apart.

Therefore, since the fixing part FX is formed to be spaced apart from the protective film 635, the area of the contact electrode CE in contact with the upper surface of the first semiconductor layer 131 increases, thus there is a technical effect of increasing the amount of current that may be injected into the first semiconductor layer 131 through the contact electrode CE. Additionally, because the amount of current injected into the first semiconductor layer 131 increases, there is a technical effect of lowering the voltage for driving the light emitting device 630.

The display device having the semiconductor light emitting device according to the above-described embodiment and manufacturing method thereof have the technical effect of utilizing the wiring for self-assembly of the light emitting device as the wiring for driving the light emitting device.

In addition, the embodiment aligns the contact electrode so that it is electrically connected only to the first semiconductor layer of the light emitting device, which has the technical effect of improving short circuit defects or reduced light efficiency when the contact electrode is misaligned.

Additionally, the embodiment has the technical effect of allowing the contact electrode to be electrically insulated from the second semiconductor layer and the auxiliary electrode of the light emitting device.

Additionally, the embodiment has the technical effect of protecting the contact electrode from external foreign substances.

Additionally, the embodiment has the technical effect of minimizing the movement of the light emitting device after self-assembly.

Additionally, the embodiment has the technical effect of minimizing corrosion and short circuit defects in a plurality of assembly wiring.

Additionally, the embodiment has the technical effect of lowering the voltage for driving a light emitting device.

The above detailed description should not be construed as restrictive in any respect and should be considered illustrative. The scope of the embodiments should be determined by reasonable interpretation of the appended claims, and all changes within the equivalent scope of the embodiments are included in the scope of the embodiments.

EXPLANATION OF REFERENCES

100, 600, 700, 900, 1000, 1300, 1400, 1600, 1700: display device
110: substrate
111: buffer layer
112: gate insulating layer
113: first passivation layer
114: first planarization layer
115: second passivation layer
116: second planarization layer
116*a*: opening
117: third planarization layer
118: protective layer
120: assembly wiring
121: first assembly wiring
121*a*: first conductive layer
121*b*: first clad layer
122: second assembly wiring
122*a*: second conductive layer
122*b*: second clad layer
123: connecting electrode
123*a*: first connection layer
123*b*: second connection layer
130, 630: light emitting device
131: first semiconductor layer
132: light emitting layer
133: second semiconductor layer
134: auxiliary electrode
135, 635: protective film
LS: light blocking layer
AA: display area
NA: non-display area
SP: sub pixel
DTR: driving transistor
ACT: active layer
GE: gate electrode
SE: source electrode
DE: drain electrode
CH: contact hole
CE: contact electrode
PE: pixel electrode
BM: black Matrix
10: ledger substrate
CB: chamber
WT: fluid
MG: magnet
PD1: first assembly pad
PD2: second assembly pad
LL: link wiring
CL: conductive layer
OL: organic layer
OL1, OL1': first part
OL2: second part
FX: fixing part

INDUSTRIAL APPLICABILITY

The embodiment may be adopted in the field of displays that display images or information.

The embodiment may be adopted in the field of displays that display images or information using a semiconductor light emitting device.

The embodiment may be adopted in the field of displays that display images or information using micro- or nano-level semiconductor light emitting devices.

The invention claimed is:

1. A display device having a semiconductor light emitting device comprising:
a substrate;
a first assembly wiring and a second assembly wiring arranged to be spaced apart from each other on the substrate;
a planarization layer disposed on the first assembly wiring and the second assembly wiring, and having an opening overlapping the first assembly wiring and the second assembly wiring;
a light emitting device disposed inside the opening and including a first semiconductor layer and a second semiconductor layer on the first semiconductor layer; and
a contact electrode electrically connecting the first assembly wiring, the second assembly wiring to the first semiconductor layer,
wherein the contact electrode is in contact with a side surface of the first semiconductor layer, a portion of the first assembly wiring overlapping the opening, and a portion of the second assembly wiring, and
wherein one end of the contact electrode is in contact with a portion of an upper surface of the first semiconductor layer that protrudes to an outside of the second semiconductor layer.

2. The display device according to claim 1, further comprising:
a passivation layer between the first assembly wiring and the second assembly wiring and the first semiconductor layer,
wherein the passivation layer includes a contact hole exposing the first assembly wiring and the second assembly wiring at the opening.

3. The display device according to claim 1, wherein the contact electrode is configured to cover a side of the planarization layer at the opening.

4. The display device according to claim 1, further comprising a first part of an organic layer covering the contact electrode at the opening,
wherein an upper surface of the first part is disposed between an upper surface of the second semiconductor layer and an uppermost part of the contact electrode.

5. The display device according to claim 4, wherein the organic layer is spaced apart from a side of the planarization layer at the opening, and
wherein the uppermost part of the contact electrode is disposed between the organic layer and the side of the planarization layer at the opening.

6. The display device according to claim 4, wherein the organic layer is in contact with a side of the planarization layer at the opening, and wherein the organic layer is configured to cover the uppermost part of the contact electrode.

7. A display device having a semiconductor light emitting device comprising:

a substrate;

a first assembly wiring and a second assembly wiring arranged to be spaced apart from each other on the substrate;

a planarization layer disposed on the first assembly wiring and the second assembly wiring, and having an opening overlapping the first assembly wiring and the second assembly wiring;

a light emitting device disposed inside the opening and including a first semiconductor layer and a second semiconductor layer on the first semiconductor layer;

a contact electrode electrically connecting the first assembly wiring, the second assembly wiring to the first semiconductor layer; and a fixing part covering a portion of the light emitting device, and wherein the contact electrode is in contact with a side surface of the first semiconductor layer, a portion of the first assembly wiring overlapping the opening, and a portion of the second assembly wiring, and wherein a portion of the side surface of the first semiconductor layer is in contact with the fixing part, and a remaining portion of the side surface of the first semiconductor layer is in contact with the contact electrode.

8. The display device according to claim 7, further comprising a first part of an organic layer covering the contact electrode at the opening, wherein the first part and the contact electrode are configured to surround the light emitting device together with the fixing part.

9. The display device according to claim 1, further comprising a protective film disposed on a side of the second semiconductor layer and a portion of the upper surface of the first semiconductor layer.

10. The display device according to claim 9, wherein one end portion of the contact electrode is disposed on the protective film.

11. The display device according to claim 7, further comprising a protective film in contact with a side of the second semiconductor layer and a portion of an upper surface of the first semiconductor layer.

12. The display device according to claim 11, wherein the protective film and the fixing part are spaced apart from each other, and wherein the contact electrode is configured to surround the light emitting device.

13. The display device according to claim 12, wherein the contact electrode is disposed between the protective film and the fixing part.

14. A manufacturing method for a display device having a semiconductor light emitting device, the manufacturing method comprising:

self-aligning a light emitting device inside an opening of a planarization layer overlapping a first assembly wiring and a second assembly wiring;

sequentially forming a conductive layer and an organic layer on the planarization layer and the light emitting device;

ashing the organic layer to remove a second part on a first part of the organic layer; and forming a contact electrode by etching the conductive layer corresponding to the second part, wherein the contact electrode is in contact with a side of a first semiconductor layer below the light emitting device.

15. The manufacturing method for a display device according to claim 14, wherein the removing the second part of the organic layer includes removing the second part to expose a second semiconductor layer on an upper side of the light emitting device, and leaving the first part of the organic layer surrounding the first semiconductor layer on a lower side of the light emitting device.

16. The manufacturing method for a display device according to claim 15, further comprising:

removing the first part of the organic layer after the forming the contact electrode.

17. The manufacturing method for a display device according to claim 15, further comprising:

reflowing the first part of the organic layer, wherein the reflowed first part covers an uppermost part of the contact electrode.

18. The manufacturing method for a display device according to claim 14, further comprising forming a fixing part between a side part of the planarization layer and the light emitting device in the opening, wherein the sequentially forming the conductive layer and the organic layer includes sequentially forming the conductive layer and the organic layer on the fixing part, the light emitting device, and the planarization layer.

19. The manufacturing method for a display device according to claim 14, further comprising:

sequentially forming a passivation layer and the planarization layer on the first assembly wiring and the second assembly wiring;

forming the opening in the planarization layer; and forming a contact hole exposing the first assembly wiring and the second assembly wiring to the passivation layer disposed inside the opening after the self-aligning the light emitting device inside the opening, wherein the contact electrode is in contact with a side surface of the first semiconductor layer, a portion of the first assembly wiring overlapping the opening, and a portion of the second assembly wiring.

20. The display device according to claim 7, wherein one end of the contact electrode is in contact with a portion of an upper surface of the first semiconductor layer that protrudes to an outside of the second semiconductor layer.

* * * * *